United States Patent
Huang et al.

(10) Patent No.: US 11,575,102 B2
(45) Date of Patent: Feb. 7, 2023

(54) DISPLAY SUBSTRATE, PREPARATION METHOD THEREOF AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Weiyun Huang, Beijing (CN); Young Yik Ko, Beijing (CN); Sanghun Kang, Beijing (CN); Wenbo Hu, Beijing (CN)

(73) Assignees: CHENGDU BOE OPTOELECTRONICS TECHNOLOGY GO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 345 days.

(21) Appl. No.: 16/642,099

(22) PCT Filed: Mar. 26, 2019

(86) PCT No.: PCT/CN2019/079717
§ 371 (c)(1),
(2) Date: Feb. 26, 2020

(87) PCT Pub. No.: WO2020/191623
PCT Pub. Date: Oct. 1, 2020

(65) Prior Publication Data
US 2021/0151707 A1 May 20, 2021

(51) Int. Cl.
*H01L 27/32* (2006.01)
*H01L 51/52* (2006.01)
*H01L 51/56* (2006.01)

(52) U.S. Cl.
CPC ...... *H01L 51/5209* (2013.01); *H01L 27/3234* (2013.01); *H01L 27/3246* (2013.01);
(Continued)

(58) Field of Classification Search
CPC ............ H01L 27/3258; H01L 27/3246; H01L 27/3234; H01L 51/5209
See application file for complete search history.

(56) References Cited

U.S. PATENT DOCUMENTS 9,276,049 B2  3/2016  Go
10,629,662 B2  4/2020  Ding et al.
(Continued)

FOREIGN PATENT DOCUMENTS

CN  104821325 A  8/2015
CN  106887523 A  6/2017
(Continued)

OTHER PUBLICATIONS

U.S. Office Action from U.S. Appl. No. 16/768,283 dated Mar. 25, 2022.
(Continued)

*Primary Examiner* — Douglas M Menz
(74) *Attorney, Agent, or Firm* — Dilworth & Barrese, LLP.; Michael J. Musella, Esq.

(57) ABSTRACT

A display substrate and a preparation method thereof, and a display device are provided. The display substrate includes a display region and an opening region, the display region surrounds the opening region, a first barrier wall is between the display region and the opening region, and the first barrier wall surrounds the opening region; the first barrier wall includes a first metal layer structure, and at least one side surface, surrounding the opening region, of the first metal layer structure includes a recess.

19 Claims, 14 Drawing Sheets

(52) U.S. Cl.
CPC ...... *H01L 27/3258* (2013.01); *H01L 27/3262* (2013.01); *H01L 27/3265* (2013.01); *H01L 51/5225* (2013.01); *H01L 51/5246* (2013.01); *H01L 51/5253* (2013.01); *H01L 51/56* (2013.01); *H01L 2227/323* (2013.01)

(56) References Cited

U.S. PATENT DOCUMENTS

| | | |
|---|---|---|
| 10,872,932 B2 | 12/2020 | Shi et al. |
| 11,469,392 B2 | 10/2022 | Zhang et al. |
| 2014/0131683 A1 | 5/2014 | Kim et al. |
| 2017/0110532 A1 | 4/2017 | Kim et al. |
| 2017/0148856 A1 | 5/2017 | Choi et al. |
| 2017/0162637 A1 | 6/2017 | Choi et al. |
| 2017/0287993 A1 | 10/2017 | Takata |
| 2017/0373129 A1 | 12/2017 | Kim et al. |
| 2018/0151834 A1 | 5/2018 | Kanaya |
| 2019/0051859 A1 | 2/2019 | Choi et al. |
| 2020/0006697 A1 | 1/2020 | Jung |
| 2020/0127215 A1 | 4/2020 | Wang et al. |
| 2020/0235333 A1 | 7/2020 | Sung et al. |
| 2021/0020866 A1 | 1/2021 | Choi et al. |
| 2021/0167323 A1 | 6/2021 | Jung et al. |
| 2022/0123261 A1 | 4/2022 | Lee et al. |

FOREIGN PATENT DOCUMENTS

| | | |
|---|---|---|
| CN | 107579171 A | 1/2018 |
| CN | 107808896 A | 3/2018 |
| CN | 108666347 A | 10/2018 |
| CN | 109360843 A | 2/2019 |
| CN | 109427861 A | 3/2019 |
| CN | 109742121 A | 5/2019 |
| CN | 110164916 A | 8/2019 |
| CN | 110212113 A | 9/2019 |
| CN | 110246984 A | 9/2019 |
| WO | 2019030858 A1 | 2/2019 |

OTHER PUBLICATIONS

First Office Action from Indian Patent Application No. 202017047309 dated Dec. 7, 2021.

DISPLAY SUBSTRATE, PREPARATION METHOD THEREOF AND DISPLAY DEVICE

TECHNICAL FIELD

Embodiments of the present disclosure relate to a display substrate and a preparation method thereof, and a display device.

BACKGROUND

At present, a display screen of a display device is developing towards large screen and full screen. Generally, a display device (e.g., a mobile phone, a tablet computer, etc.) has a camera device (or an imaging device), which is usually disposed on a side outside the display region of the display screen. However, installation of the camera device requires a certain position, which is not beneficial to a design of full screen and narrow frame of the display screen. For example, the camera device may be combined with the display region of the display screen, and a position is reserved for the camera device in the display region, so as to maximize the display region of the display screen.

SUMMARY

At least one embodiment of the present disclosure provides a display substrate, the display substrate comprises a display region and an opening region, the display region surrounds the opening region; a first barrier wall is between the display region and the opening region, and the first barrier wall surrounds the opening region; the first barrier wall comprises a first metal layer structure, and at least one side surface, surrounding the opening region, of the first metal layer structure comprises a recess.

For example, in the display substrate provided by at least one embodiment of the present disclosure, the display region comprises an electrode pattern, the electrode pattern comprises a second metal layer structure, the first metal layer structure and the second metal layer structure have a same structure and comprise a same material.

For example, the display substrate provided by at least one embodiment of the present disclosure further comprises a base substrate, the first metal layer structure comprises: a first metal sub-layer on a first side of the base substrate, a second metal sub-layer on a side of the first metal sub-layer away from the base substrate; an orthographic projection of the first metal sub-layer on the base substrate is within an orthographic projection of the second metal sub-layer on the base substrate, so as to form the recess.

For example, in the display substrate provided by at least one embodiment of the present disclosure, the first metal layer structure further comprises a third metal sub-layer, and the third metal sub-layer is on the first side of the base substrate; the first metal sub-layer is on a side of the third metal sub-layer away from the base substrate, and the orthographic projection of the first metal sub-layer on the base substrate is within an orthographic projection of the third metal sub-layer on the base substrate.

For example, in the display substrate provided by at least one embodiment of the present disclosure, the orthographic projection of the second metal sub-layer on the base substrate is within the orthographic projection of the third metal sub-layer on the base substrate.

For example, in the display substrate provided by at least one embodiment of the present disclosure, a thickness of the first metal sub-layer is larger than a thickness of the second metal sub-layer and is larger than a thickness of the third metal sub-layer.

For example, in the display substrate provided by at least one embodiment of the present disclosure, the thickness of the first metal sub-layer ranges from 150 nm to 900 nm, the thickness of the second metal sub-layer ranges from 30 nm to 300 nm, and the thickness of the third metal sub-layer ranges from 30 nm to 300 nm.

For example, in the display substrate provided by at least one embodiment of the present disclosure, an indentation direction of the recess is parallel to the base substrate.

For example, the display substrate provided by at least one embodiment of the present disclosure further comprises a second barrier wall that is between the display region and the opening region, the second barrier wall surrounds the opening region, has a same structure as the first barrier wall, and is arranged on a side of the first barrier wall away from the opening region.

For example, in the display substrate provided by at least one embodiment of the present disclosure, the display region further comprises a first electrode layer, a second electrode and an organic functional layer between the first electrode layer and the second electrode layer, the first electrode layer, the second electrode layer, and the organic functional layer are configured to form a light emitting device; and the organic functional layer is disconnected at the side surface, comprising the recess, of the first barrier wall.

For example, in the display substrate provided by at least one embodiment of the present disclosure, the second electrode layer is a cathode layer, and the cathode layer is disconnected at the side surface, comprising the recess, of the first barrier wall.

For example, the display substrate provided by at least one embodiment of the present disclosure further comprises an image sensor and/or an infrared sensor, the image sensor and/or the infrared sensor is connected to the base substrate, and an orthographic projection of the image sensor and/or the infrared sensor on the base substrate at least partially overlaps with the opening region.

For example, in the display substrate provided by at least one embodiment of the present disclosure, under action of an etching solution for etching to form the first metal layer structure, an etching rate of a material of the first metal sub-layer is larger than an etching rate of a material of the second metal sub-layer.

For example, in the display substrate provided by at least one embodiment of the present disclosure, the material of the first metal sub-layer comprises aluminum or copper; the material of the second metal sub-layer comprises titanium or molybdenum.

For example, in the display substrate provided by at least one embodiment of the present disclosure, the first barrier wall further comprises an insulation layer structure, the insulation layer structure is on the first side of the base substrate, and the first metal layer structure is on a side of the insulation layer structure away from the base substrate.

For example, in the display substrate provided by at least one embodiment of the present disclosure, the insulation layer structure comprises a plurality of insulation sub-layers.

At least one embodiment of the present disclosure further provides a preparation method of a display substrate, the preparation method comprises: forming a display region and an opening region, in which the display region surrounds the opening region, and forming a first barrier wall between the display region and the opening region, in which the first barrier wall surrounds the opening region and comprises a first metal layer structure, and a recess is formed on at least one side surface, surrounding the opening region, of the first metal layer structure.

For example, in the preparation method provided by at least one embodiment of the present disclosure, the opening region is formed by laser cutting or mechanical punching.

For example, in the preparation method provided by at least one embodiment of the present disclosure, forming the display region comprises: forming an electrode pattern when forming the first metal layer structure, in which the electrode pattern comprises a second metal layer structure, and the first metal layer structure and the second metal layer structure are formed using a same layer.

For example, in the preparation method provided by at least one embodiment of the present disclosure, forming the first barrier wall comprises: forming a first metal material layer on a first side of a base substrate, and forming a second metal material layer on a side of the first metal material layer away from the base substrate; performing a first etching process on the first metal material layer and the second metal material layer to form the electrode pattern and an initial barrier wall; and performing a second etching process on the initial barrier wall to form the first barrier wall, in which a wet etching method is adopted in the second etching process, and an etching rate produced by an etching solution used in the second etching process on the first metal material layer is larger than an etching rate produced by the etching solution on the second metal material layer, so that the recess is formed.

For example, in the preparation method provided by at least one embodiment of the present disclosure, forming the first barrier wall comprises: sequentially forming a third metal material layer, a first metal material layer and a second metal material layer on a first side of a base substrate; performing a first etching process on the third metal material layer, the first metal material layer and the second metal material layer to form the electrode pattern and an initial barrier wall; and performing a second etching process on the initial barrier wall to form the first barrier wall, in which a wet etching method is adopted in the second etching process, and an etching rate produced by an etching solution used in the second etching process on the first metal material layer is larger than an etching rate produced by the etching solution on the second metal material layer and is larger than an etching rate produced by the etching solution on the third metal material layer, so that the recess is formed.

For example, in the preparation method provided by at least one embodiment of the present disclosure, the first etching process adopts a dry etching method.

For example, in the preparation method provided by at least one embodiment of the present disclosure, forming the display region further comprises forming a first electrode layer, a second electrode layer, and an organic functional layer between the first electrode layer and the second electrode layer, the first electrode layer, the second electrode layer, and the organic functional layer are configured to form a light emitting device, in which the etching solution used in the second etching process is same as an etching solution used for etching to form the first electrode layer, and the organic functional layer is disconnected at the side surface, comprising the recess, of the first barrier wall.

For example, in the preparation method provided by at least one embodiment of the present disclosure, forming the first barrier wall comprises: forming a first metal material layer on a first side of a base substrate; forming a second metal material layer on a side of the first metal material layer away from the base substrate; and performing one wet etching process on the first metal material layer and the second metal material layer, in which an etching rate produced by an etching solution used in the wet etching process on the first metal material layer is larger than an etching rate produced by the etching solution on the second metal material layer.

For example, the preparation method provided by at least one embodiment of the present disclosure further comprises: forming a second barrier wall between the display region and the opening region, in which the second barrier wall surrounds the opening region and is formed on a side of the first barrier wall away from the opening region, and the second barrier wall and the first barrier wall are formed using a same layer.

At least one embodiment of the present disclosure further provides a display device, and the display device comprises any one of the display substrates mentioned above.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment (s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left," "right" and the like are only used to indicate relative position relationship, and when the position of the object which is described is changed, the relative position relationship may be changed accordingly.

In order to maximize a display region of a display device, a camera device (an imaging device) of the display device can be combined with the display region, and the camera device is disposed in the display region.

Figure 1A:
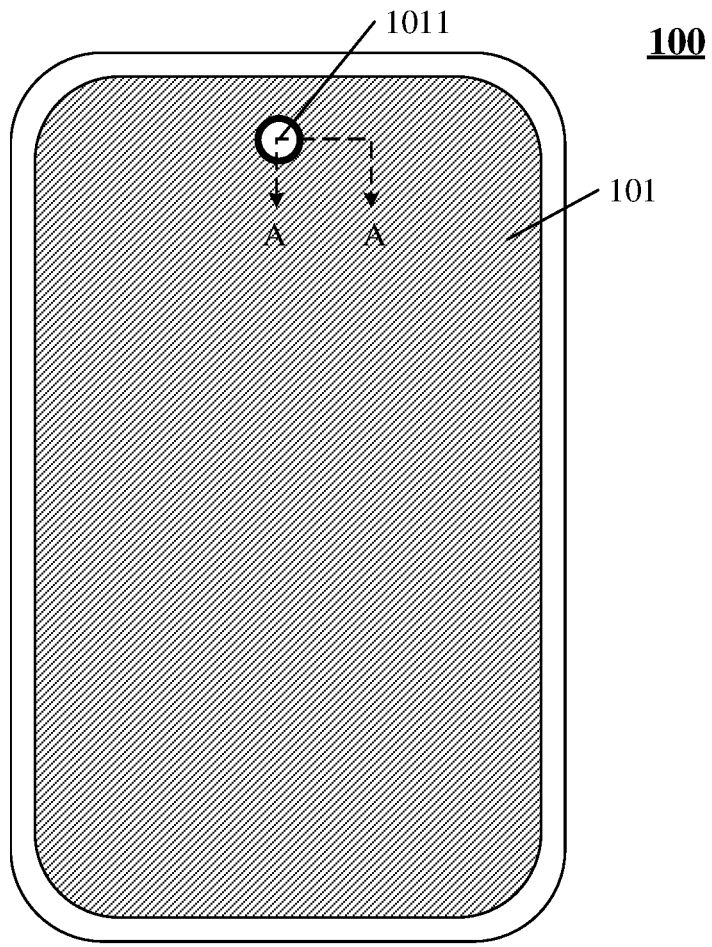
FIG. 1A is a planar schematic diagram of a display substrate.
Figure 1B:
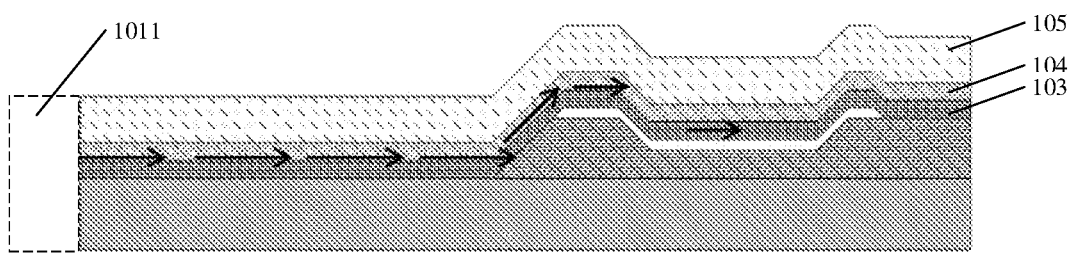
FIG. 1B is a cross-sectional schematic diagram taken along a line A-A illustrated in FIG. 1A.

For example, FIG. 1A illustrates a planar schematic diagram of a display substrate for a display device, and FIG. 1B is a cross-sectional schematic diagram of the display substrate in FIG. 1A taken along a line A-A. As illustrated in FIG. 1A, the display substrate 100 includes a display region 101, the display region 101 includes a pixel array and has an opening 1011 in the pixel array, the opening 1011 is a position reserved for a camera device (not illustrated), and the camera device may be disposed on a back side of the display substrate 100 opposite to a display side, so that the camera device can acquire an image through the opening 1011. Thus, the camera device is combined with the display region 101 of the display substrate 100.

The display region 101 has light emitting devices for display, for example, the light emitting devices are organic light emitting diodes, and an organic functional layer 103 and an electrode layer 104 of a plurality of light emitting devices in all or part of the display region 101 are generally formed on the whole surface of the display region 101, respectively. Therefore, where an encapsulation layer 105 is used for encapsulation, a region near the opening 1011 is often difficult to be encapsulated, or even the opening 1011 is encapsulated, it is difficult to ensure an encapsulation effect of this region. In this case, as illustrated in FIG. 1B, impurities such as water, oxygen and so on can enter the display region 101 from the opening 1011 along the organic functional layer 103 and the electrode layer 104 that are formed on the whole surface of the display region 101, and contaminate functional materials in the display region 101, thereby causing performances of the functional materials to deteriorate, and further affecting the display effect of the display region 101.

At least one embodiment of the present disclosure provides a display substrate, the display substrate comprises a display region and an opening region, the display region surrounds the opening region, a first barrier wall is between the display region and the opening region, and the first barrier wall surrounds the opening region; the first barrier wall comprises a first metal layer structure, and at least one side surface, surrounding the opening region, of the first metal layer structure comprises a recess.

At least one embodiment of the present disclosure provides a preparation method of a display substrate, and the method comprising: forming a display region and an opening region, forming a first barrier wall between the display region and the opening region, in which the display region surrounds the opening region, the first barrier wall surrounds the opening region and comprises a first metal layer structure, and a recess is formed on at least one side surface, surrounding the opening region, of the first metal layer structure.

At least one embodiment of the present disclosure provides a display device, and the display device comprises the above-mentioned display substrate.

The display substrate, the preparation method thereof and the display device provided by some embodiments of the present disclosure are described by several specific embodiments in the following.

Figure 2A:
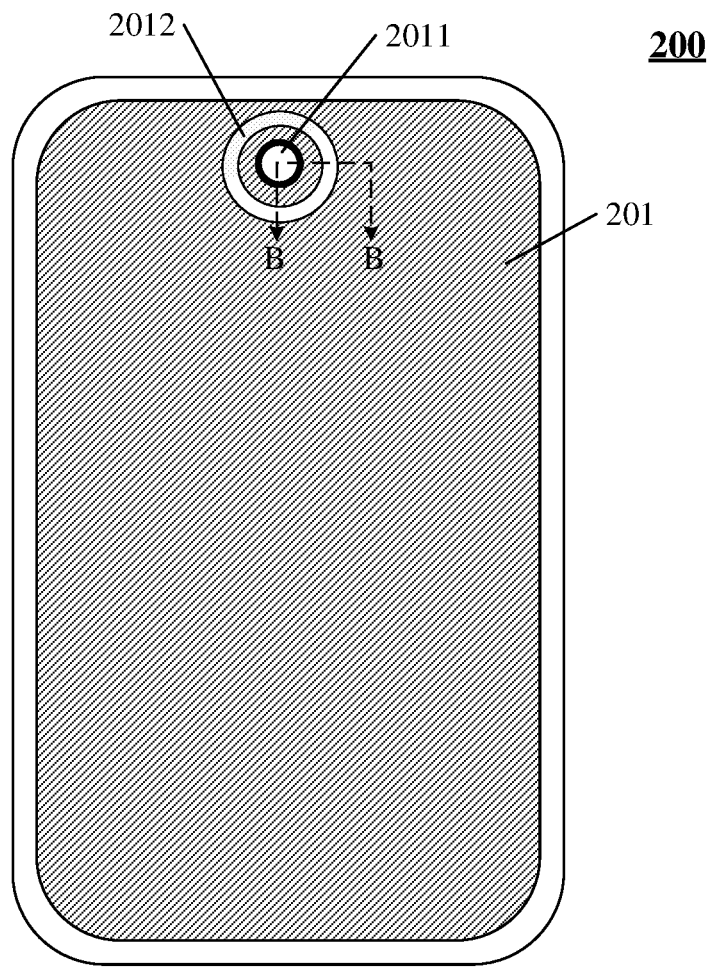
FIG. 2A is a planar schematic diagram of a display substrate provided by some embodiments of the present disclosure.

At least one embodiment of the present disclosure provides a display substrate. FIG. 2A illustrates a planar schematic diagram of the display substrate, and FIG. 2B is a cross-sectional schematic diagram of the display substrate in FIG. 2A taken along a line B-B.

Figure 2B:
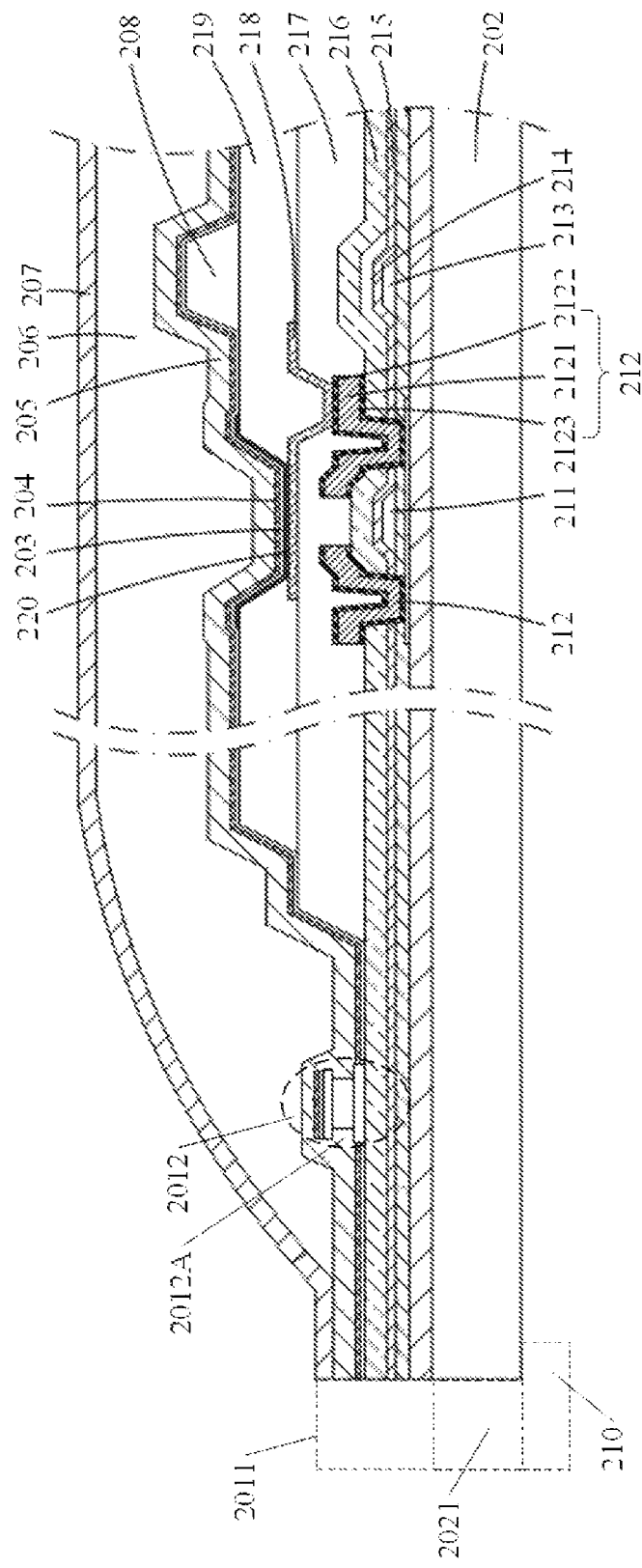
FIG. 2B is a cross-sectional schematic diagram taken along a line B-B illustrated in FIG. 2A.

As illustrated in FIG. 2A and FIG. 2B, the display substrate 200 includes a display region 201 and an opening region 2011, and the display region 201 surrounds the opening region 2011; a first barrier wall 2012 is between the display region 201 and the opening region 2011, and the first barrier wall 2012 surrounds the opening region 2011. The first barrier wall 2012 includes a first metal layer structure, and at least one side surface of the first metal layer structure surrounding the opening region 2011 includes a recess 2012A. The opening region 2011 allows light from a display side (an upper side in FIG. 2B) of the display substrate to be transmitted through the display substrate, and thereby the light reaches a back side (a lower side in FIG. 2B) of the display substrate.

For example, in the first metal layer structure illustrated in FIG. 2B, both a side surface of the first metal layer structure facing the opening region 2011 and a side surface away from the opening region 2011 include the recesses 2012A, and in other examples of this embodiment, for example, the recess 2012A may be provided on only one side surface of the first metal layer structure.

For example, in this embodiment, the display region 201 includes a pixel array for performing a display operation, the pixel array includes a plurality of pixel units arranged in an array, and each pixel unit includes a driving circuit, a light emitting circuit, and the like, and therefore the display region 201 further includes an electrode pattern, and the electrode pattern includes a second metal layer structure; the first metal layer structure and the second metal layer structure have a same structure and include a same material. For example, the first metal layer structure and the second metal layer structure are formed in a same layer and have a same multi-layer structure in a preparation process of the display substrate, and in the first metal layer structure and the second metal layer structure, materials of corresponding layers are all the same, and therefore the first metal layer structure and the second metal layer structure may be formed by the same layer(s).

For example, as illustrated in FIG. 2B, the display region 201 includes the pixel array, and the plurality of pixel units of the pixel array include a plurality of light emitting devices for display and driving circuits for driving the light emitting devices. For example, each light emitting device includes structures such as an electrode layer, an organic functional layer, and so on, and each driving circuit includes structures such as a thin film transistor, a capacitor, and so on.

As illustrated in FIG. 2B, the light emitting device includes a first electrode layer 218, a second electrode layer 204, and an organic functional layer between the first electrode layer 218 and the second electrode layer 204. For example, the organic functional layer includes an organic light emitting material layer 220 and an auxiliary light emitting layer 203, and the auxiliary light emitting layer 203 is, for example, an electron transport layer or an electron injection layer, etc. At least a portion of the organic functional layer for the light emitting devices for the plurality of pixel units, such as the auxiliary light emitting layer 203, and the second electrode layer 204, are generally formed on the whole surface of the display region 201, respectively, and in this case, the organic functional layer is disconnected at the side surface, including the recess 2012A, of the first barrier wall 2012. For example, the first electrode layer 218 is an anode layer (or referred to as a pixel electrode layer), the second electrode layer 204 is a cathode layer, and the cathode layer is also disconnected at the side surface, including the recess 2012A, of the first barrier wall 201. Thus, where the organic functional layer and the second electrode layer 204 that are on a side close to the opening region 2011 are contaminated by impurities such as water, oxygen, etc., because the organic functional layer and the second electrode layer 204 are disconnected by the first barrier wall 2012, these contaminated impurities cannot extend into a portion of the organic functional layer and the second electrode layer 204 for light emission used in the light emitting device. For example, a portion of the organic functional layer and a portion of the second electrode layer 204 are also formed on the top of the first barrier wall 2012, but these portions are separated from other portions of the organic functional layer and the second electrode layer 204.

For example, the thin film transistor includes a gate electrode 211, source and drain electrodes 212, etc., and the capacitor includes a first electrode 213, a second electrode 214, and a first insulation layer 215 between the first electrode 213 and the second electrode 214. For example, the gate electrode 211 or each of the source and drain electrodes 212 may be implemented as the electrode pattern having the second metal layer structure. For example, it is illustrated in FIG. 2B that each of the source and drain electrodes 212 includes the second metal layer structure. In this case, the first metal layer structure of the first barrier wall 2012 and the second metal layer structure of the source and drain electrode 212 have the same structure and comprise the same material(s). For example, the first metal layer structure of the first barrier wall 2012 and the second metal layer structure of the source and drain electrode 212 are formed in the same layer and have the same multi-layer structure, so that the first metal layer structure of the first barrier wall 2012 and the second metal layer structure of the source and drain electrode 212 may be formed using the same layers in the preparation process of the display substrate 200. For example, in some examples, each of the first metal layer structure and the second metal layer structure has the multi-layer structure, such as a double-layer structure or a three-layer structure, and the like.

For example, as illustrated in FIG. 2B, the display substrate 200 further includes a base substrate 202, the display region 201 is on the base substrate 202, and the base substrate 202 has an opening 2021 located in the opening region 2011. For example, an indentation direction of the recess in the first metal layer structure of the first barrier wall 2012 is parallel to the base substrate 202. For example, in the embodiment illustrated in FIG. 2B, the base substrate 202 is arranged in a horizontal direction, and the indentation direction of the recess is the horizontal direction.

Figure 3:
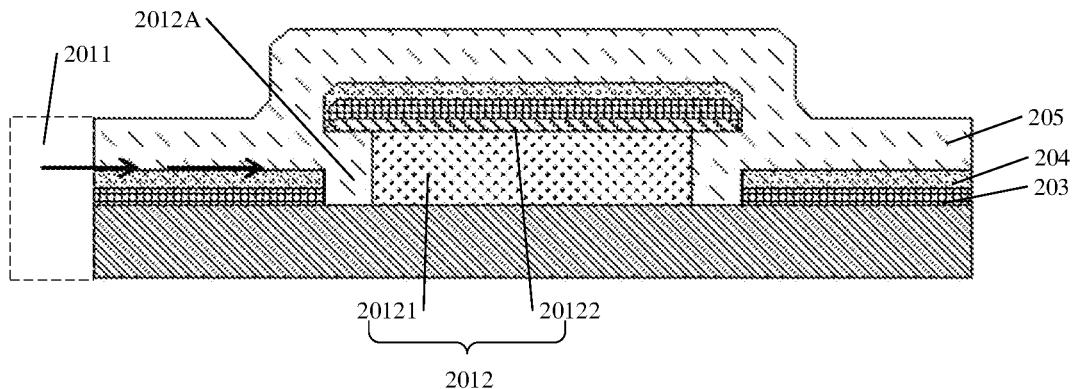
FIG. 3 is a cross-sectional schematic diagram of a barrier wall in a display substrate provided by some embodiments of the present disclosure.

For example, in an example, as illustrated in FIG. 3, the first metal layer structure of the first barrier wall 2012 includes a double-layer metal layer structure, i.e., a first metal sub-layer 20121 and a second metal sub-layer 20122. The first metal sub-layer 20121 is on a first side of the base substrate 202 (a side on which the light emitting device is to be formed, illustrated as an upper side of the base substrate 202 in the figure), the second metal sub-layer 20122 is on a side of the first metal sub-layer 20121 away from the base substrate 202 (illustrated as an upper side of the first metal sub-layer 20121 in the figure), and an orthographic projection of the first metal sub-layer 20121 on the base substrate 202 is within an orthographic projection of the second metal sub-layer 20122 on the base substrate 202, thereby forming the recess 2012A on the side surface of a stacked layer formed by the first metal sub-layer 20121 and the second metal sub-layer 20122. In this case, where the organic functional layer and the second electrode layer 204 are formed on the base substrate 202 on which the first barrier wall 2012 is formed, the organic functional layer and the second electrode layer 204 are respectively disconnected at the first barrier wall 2012, and therefore a route for impurities such as water, oxygen and the like to enter the display region 201 is broken.

Figure 4:
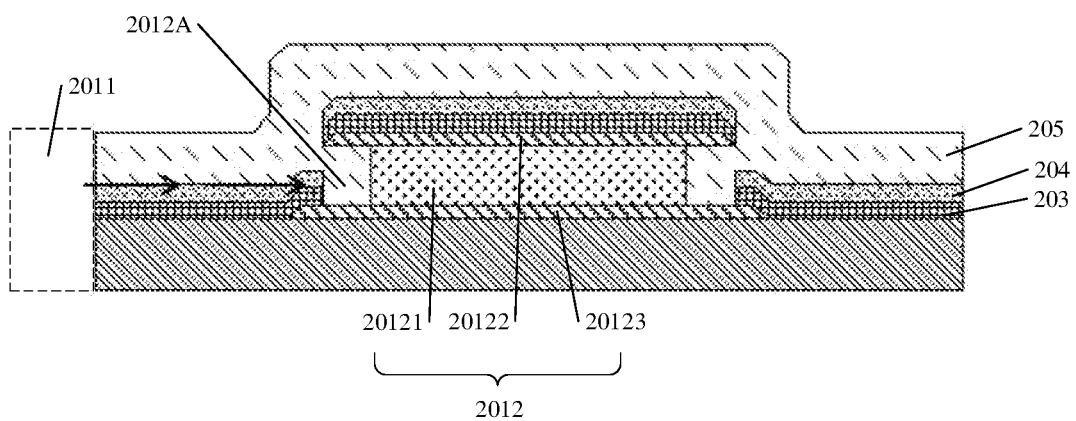
FIG. 4 is a cross-sectional schematic diagram of a barrier wall in a display substrate provided by some embodiments of the present disclosure.

For example, in one example, as illustrated in FIG. 4, the first metal layer structure of the first barrier wall 2012 includes a three-layer metal layer structure, that is, a first metal sub-layer 20121, a second metal sub-layer 20122, and a third metal sub-layer 20123; the third metal sub-layer 20123 is on a first side (illustrated as the upper side of the base substrate 202 in the figure) of the substrate base 202, the first metal sub-layer 20121 is on a side of the third metal sub-layer 20123 away from the base substrate 202 (illustrated as an upper side of the third metal sub-layer 20123), the second metal sub-layer 20122 is on a side of the first metal sub-layer 20121 away from the base substrate 202 (illustrated as the upper side of the first metal sub-layer 20121), an orthographic projection of the first metal sub-layer 20121 on the base substrate 202 is within an orthographic projection of the second metal sub-layer 20122 on the base substrate 202, and the orthographic projection of the first metal sub-layer 20121 on the base substrate 202 is also within an orthographic projection of the third metal sub-layer 20123 on the base substrate 202, thereby forming the recess 2012A on the side surface of a stacked layer formed by the first metal sub-layer 20121, the second metal sub-layer 20122 and the third metal sub-layer 20123. In this case, where the organic functional layer and the second electrode layer 204 are formed on the base substrate 202 on which the first barrier wall 2012 is formed, the organic functional layer and the second electrode layer 204 are respectively disconnected at the first barrier wall 2012, and therefore the route for impurities such as water, oxygen and the like to enter the display region 201 is broken.

For example, in some examples, the orthographic projection of the second metal sub-layer 20122 on the base substrate 202 is within the orthographic projection of the third metal sub-layer 20123 on the base substrate 202. In this case, the orthographic projection of the third metal sub-layer 20123 on the base substrate 202 is the largest one, thereby increasing the bonding strength between the first metal layer structure of the first barrier wall 2012 and the display substrate, enhancing the stability of the first metal layer structure, and facilitating the disconnection of the organic functional layer and the second electrode layer 204 at the position of the first barrier wall 2012.

For example, FIG. 2B illustrates an example of the three-layer metal layer structure, in this example, the second metal layer structure of the source-drain electrode 212 includes a metal sub-layer 2123 that is in the same layer as the third metal sub-layer 20123, a metal sub-layer 2121 that is in the same layer as the first metal sub-layer 20121, and a metal sub-layer 2122 that is in the same layer as the second metal sub-layer 20122.

In the case illustrated in FIG. 2B, the second metal layer structure of the source and drain electrode 212 in the thin film transistor and the first metal layer structure are formed in the same layer and have the same multi-layer structure, i.e. each of the two has the three-layer metal layer structure, so that in the preparation process of the display substrate 200, the first metal layer structure of the first barrier wall 2012 and the second metal layer structure of the source and drain electrode 212 can be formed using the same layer(s) by one same preparation process, so as to simplify steps of the preparation process.

For example, in the first metal layer structure of the first barrier wall 2012, a thickness of the first metal sub-layer 20121 is larger than a thickness of the second metal sub-layer 20122 and is larger than a thickness of the third metal sub-layer 20123, which is more beneficial to forming the recess and is more beneficial to the disconnection of the organic material layer 203 and the second electrode layer 204 at the position of the first barrier wall 2012, and therefore the first barrier wall 2012 can achieve a better barrier effect. For example, the thickness of the first metal sub-layer 20121 ranges from 150 nm to 900 nm, such as 200 nm, 400 nm, 600 nm, 800 nm, etc. The thickness of the second metal sub-layer 20122 ranges from 30 nm to 300 nm, for example, 100 nm, 150 nm or 200 nm. The thickness of the third metal sub-layer 20123 ranges from 30 nm to 300 nm, for example, 100 nm, 150 nm, 200 nm, etc. For example, in one example, the thickness of the first metal sub-layer 20121 is 600 nm, the thickness of the second metal sub-layer 20122 is 200 nm, and the thickness of the third metal sub-layer 20123 is 200 nm. In this case, the first barrier wall 2012 can sufficiently realize the barrier function.

For example, in some embodiments of the present disclosure, a material of the second metal sub-layer 20122 may be the same as a material of the third metal sub-layer 20123, and a material of the first metal sub-layer 20121 and the material of the second metal sub-layer 20122 have different etching rates during etching. For example, under action of an etching solution for etching to form the first metal layer structure, an etching rate of the material of the first metal sub-layer 20121 is larger than an etching rate of the material of the second metal sub-layer 20122, so that the first metal layer structure including the recess 2012A is easily formed during the preparation process.

For example, in some embodiments, the material of the first metal sub-layer 20121 includes a metal such as aluminum or copper or an alloy thereof, the material of the second metal sub-layer 20122 includes a metal such as titanium or molybdenum or an alloy thereof, and the material of the third metal sub-layer 20123 is the same as the material of the second metal sub-layer 20122, including a metal such as titanium or molybdenum or an alloy thereof. Under the action of an etching solution for etching to form an electrode structure of the display substrate such as the second electrode layer 204, an etching rate produced by the etching solution on aluminum or copper is larger than an etching rate produced by the etching solution on titanium or molybdenum. Therefore, the first metal sub-layer 20121, the second metal sub-layer 20122, and the third metal sub-layer 20123 can be etched to form the recess 2012A when etching to form the electrode structure such as the second electrode layer 204.

For example, in some examples, in the case where the first metal layer structure adopts the double-layer structure, a combination of the material of the first metal sub-layer 20121 and the material of the second metal sub-layer 20122 includes aluminum/titanium, aluminum/molybdenum, copper/titanium or copper/molybdenum, etc.; for example, in the case where the first metal layer structure adopts the three-layer structure, a combination of the material of the third metal sub-layer 20123, the material of the first metal sub-layer 20121 and the material of the second metal sub-layer 20122 includes titanium/aluminum/titanium, molybdenum/aluminum/molybdenum, titanium/copper/titanium or molybdenum/copper/molybdenum, etc.

For example, in some embodiments of the present disclosure, as illustrated in FIG. 2B, the display substrate 200 further includes an image sensor and/or an infrared sensor, the image sensor and/or the infrared sensor are/is connected to the base substrate 202, for example, on a side of the base substrate 202 away from the lighting emitting device, and an orthographic projection of the image sensor and/or the infrared sensor on the base substrate 202 at least partially overlaps with the opening region 2011, for example, the image sensor and/or the infrared sensor may be provided at the position indicated by the reference numeral 210 in the figure. Thus, the image sensor and/or the infrared sensor can realize functions of image acquisition, face recognition, infrared sensing and the like through the opening region 2011.

It should be noted that, in some examples of this embodiment, the display substrate 200 may further include structures such as a second insulation layer 216 covering the capacitor, a planarization layer 217 for planarizing the driving circuit, a pixel definition layer 219 for defining the pixel array, a columnar spacer 208 for forming an encapsulation space, an encapsulation layer 205 for sealing, a second encapsulation layer 206 and a third encapsulation layer 207 for further improving the encapsulation effect, and the like, and these structures are not described in detail in the embodiments of the present disclosure. In some examples of this embodiment, because one of the source and drain electrodes 212 of the thin film transistor is connected to the first electrode layer 218, this thin film transistor is a driving transistor, that is, the driving transistor controls the magnitude of a light emitting current flowing through the light emitting device according to a data signal applied thereto, thereby controlling the gray scale of the pixel units in a display process.

Figure 2C:
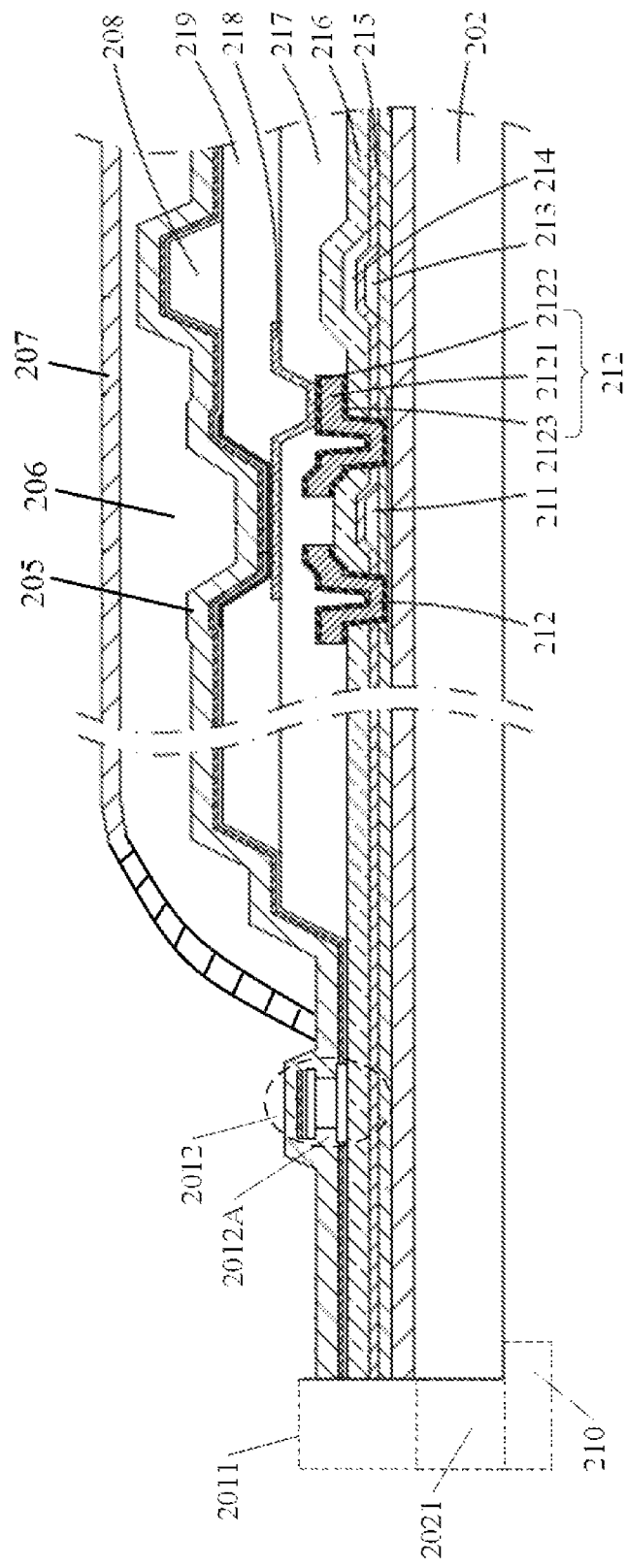
FIG. 2C is another cross-sectional schematic diagram taken along a line B-B illustrated in FIG. 2A.

For example, the encapsulation layer 205 is an inorganic encapsulation layer, including a material such as silicon oxide, silicon nitride, or the like, the second encapsulation layer 206 is an organic encapsulation layer, including an organic material such as polyimide or the like, and the third encapsulation layer 207 is an inorganic encapsulation layer, including a material such as silicon oxide, silicon nitride, or the like. For example, in the example illustrated in FIG. 2B, all of the encapsulation layer 205, the second encapsulation layer 206, and the third encapsulation layer 207 extend to one side of the first barrier wall 2012 close to the opening region 2011, so that all the three encapsulation layers encapsulate the first barrier wall 2012. In other examples, as illustrated in FIG. 2C, the encapsulation layer 205 extends to the side of the first barrier wall 2012 close to the opening region 2011, and both the second encapsulation layer 206 and the third encapsulation layer 207 terminate at a side of the first barrier wall 2012 close to the display region 201. Because the organic material has a relatively weak ability of blocking water and oxygen, the second encapsulation layer 206 including the organic material terminating at a position further away from the opening region 2011 can prevent the impurities such as water, oxygen and the like from entering the display region 201 through the second encapsulation layer 206. For example, in some examples, both the encapsulation layer 205 and the third encapsulation layer 207 may extend to the side of the first barrier wall 2012 close to the opening region 2011, while only the second encapsulation layer 206 terminates at the side of the first barrier wall 2012 close to the display region 201, and this example can also prevent the impurities such as water, oxygen and the like from entering the display region 201 through the second encapsulation layer 206 including the organic material. The embodiments of the present disclosure do not limit the specific arrangement of the encapsulation layer 205, the second encapsulation layer 206 and the third encapsulation layer 207.

In some embodiments of the present disclosure, for example, more than one barrier walls may be provided around the opening region 2011 of the display panel, i.e., multiple barrier walls may be provided, e.g., two barrier walls, three barrier walls, four barrier walls, or five barrier walls, etc. may be provided to enhance the barrier effect.

Figure 5A:
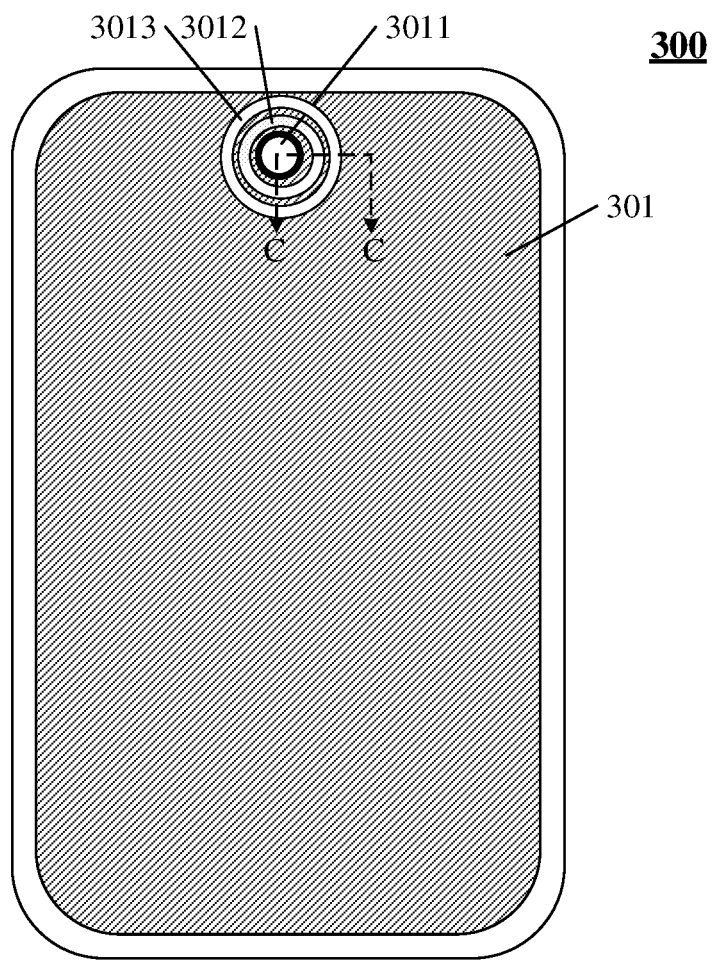
FIG. 5A is a planar schematic diagram of another display substrate provided by some embodiments of the present disclosure.
Figure 5B:
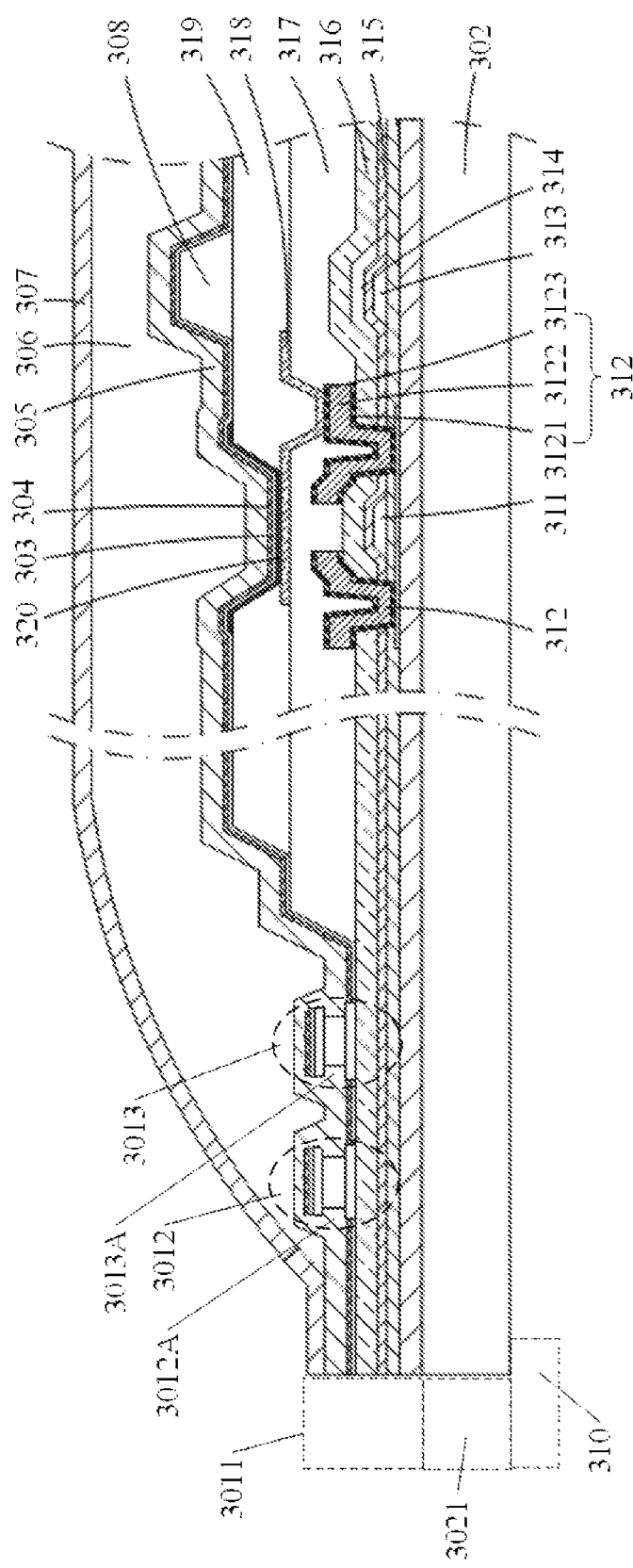
FIG. 5B is a cross-sectional schematic diagram taken along a line C-C illustrated in FIG. 5A.

For example, the display substrate illustrated in FIG. 5A and FIG. 5B includes two barrier walls, FIG. 5A is a planar schematic diagram of the display substrate, and FIG. 5B is a cross-sectional schematic diagram of the display substrate illustrated in FIG. 5A along a line C-C.

As illustrated in FIG. 5A and FIG. 5B, a display substrate 300 includes a display region 301 and an opening region 3011, the display region 301 surrounds the opening region 3011, a first barrier wall 3012 and a second barrier wall 3013 are between the display region 301 and the opening region 3011, both the first barrier wall 3012 and the second barrier wall 3013 surround the opening region 3011. The second barrier wall 3013 is disposed on a side of the first barrier wall 3012 away from the opening region 3011 and is spaced apart from the first barrier wall 3012 by a certain distance. Each of the first barrier wall 3012 and the second barrier wall 3013 includes a first metal layer structure, at least one side surface, surrounding the opening region 3011, of the first metal layer structure of the first barrier wall 3012 includes a recess 3012A, and at least one side surface, surrounding the open region 3011, of the first metal layer structure of the second barrier wall 3013 includes a recess 3013A.

Similar to the above embodiment, the display region 301 includes an electrode pattern, the electrode pattern includes a second metal layer structure, the first metal layer structure of the first barrier wall 3012 and the first metal layer structure of the second barrier wall 3013 have the same structure as the second metal layer structure, and include the same material as the second metal layer structure, for example, the first metal layer structure of the first barrier wall 3012, the first metal layer structure of the second barrier wall 3013, and the second metal layer structure are formed in the same layer and have the same multi-layer structure.

For example, the display region 301 includes a pixel array, and a plurality of pixel units of the pixel array include a plurality of light emitting devices for display and driving circuits for driving the light emitting devices. For example, the driving circuit includes a thin film transistor, a capacitor, etc.

As illustrated in FIG. 5B, the light emitting device includes a first electrode layer 318, a second electrode layer 304, and an organic functional layer between the first electrode layer 320 and the second electrode layer. The organic functional layer includes, for example, an organic light emitting material layer 210 and an auxiliary light emitting layer 303. At least a portion of the organic functional layer, for example, the auxiliary light emitting layer 303 and the second electrode layer 304, are generally formed on the whole surface of the display region 101, respectively. In this case, the organic functional layer is disconnected at the side surfaces, including the recesses 3012A/3013A, respectively of the first barrier wall 3012 and the second barrier wall 3013. For example, the first electrode layer 318 is an anode layer (or referred to as a pixel electrode layer), the second electrode layer 304 is a cathode layer, and the cathode layer is also disconnected at the side surfaces, including the recesses 3012A/3013A, respectively of the first barrier wall 2012 and the second barrier wall 3013. Thus, where a portion of the organic functional layer and a portion of the second electrode layer 304 that are on the side close to the opening region 3011 are contaminated by impurities such as water, oxygen, etc., because the organic functional layer and the second electrode layer 304 are disconnected by the first barrier wall 3012, these contaminated impurities cannot extend into a portion of the organic functional layer and a portion of the second electrode layer 304 for light emission used in the light emitting device. For example, a portion of the organic functional layer and a portion of the second electrode layer 304 are also formed on the top of the first barrier wall 3012, but these portions are separated from other portions of the organic functional layer and the second electrode layer 304.

Similarly, the thin film transistor includes a gate electrode 311, source and drain electrodes 312, and the like, and the capacitor includes a first electrode 313, a second electrode 314, and a first insulation layer 215 between the first electrode 313 and the second electrode 314. For example, the gate electrode 311 or each of the source and drain electrodes 312 may be implemented as the electrode pattern having the second metal layer structure. For example, it is illustrated in FIG. 5B that each of the source and drain electrodes 312 includes the second metal layer structure. In this case, the first metal layer structure of the first barrier wall 3012, the first metal layer structure of the second barrier wall 3013, and the second metal layer structure of the source and drain electrode 312 are formed in the same layer and have the same multi-layer structure, thus in the preparation process of the display substrate 200, the first metal layer structure of the first barrier wall 3012, the first metal layer structure of the second barrier wall 3013, and the second metal layer structure of the source and drain electrode 312 may be formed using the same layers. For example, in some examples, each of the first metal layer structure and the second metal layer structure has the multi-layer structure, such as a double-layer structure or a three-layer structure, and the like.

Figure 6:
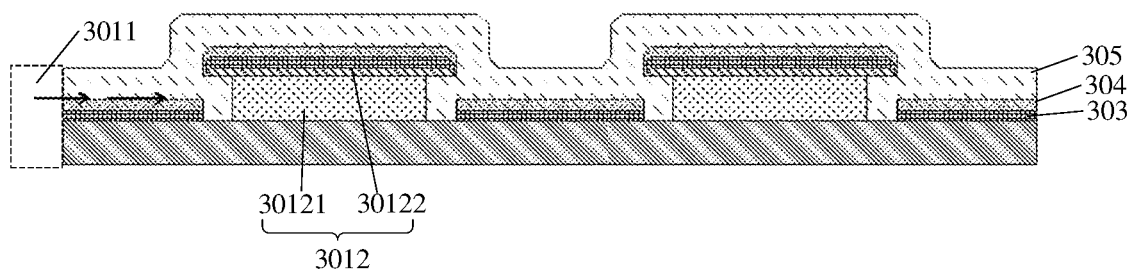
FIG. 6 is a cross-sectional schematic diagram of a barrier wall in another display substrate provided by some embodiments of the present disclosure.
Figure 7:
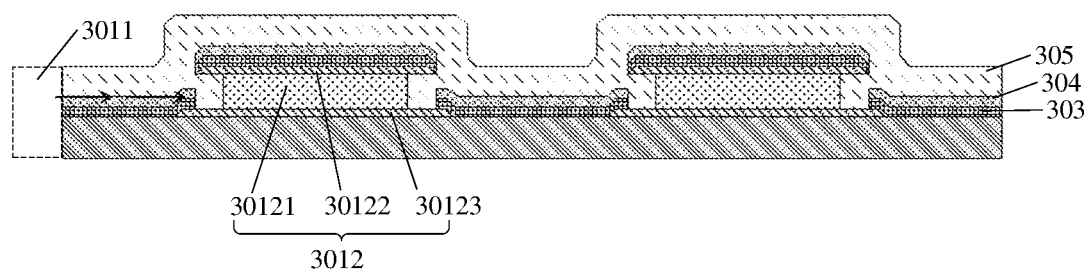
FIG. 7 is a cross-sectional schematic diagram of a barrier wall in further another display substrate provided by some embodiments of the present disclosure.

In this embodiment, as illustrated in FIG. 6 and FIG. 7, the first metal layer structure of the first barrier wall 3012 and the first metal layer structure of the second barrier wall 3013 are basically the same as the first metal layer structure in the above-mentioned embodiments, for detailed description, please refer to the above-mentioned embodiment, similar reference numerals refer to the same structures, respectively, and no repetition is given in this embodiment.

As illustrated in FIG. 5B, the display substrate 300 further includes a base substrate 302, the base substrate 302 has an opening 3021 in an opening region 3011. For example, both an indentation direction of the recess in the first metal layer structure of the first barrier wall 3012 and an indentation direction of the recess in the first metal layer structure of the second barrier wall 3013 are parallel to the base substrate 302.

For example, the display substrate 300 further includes an image sensor and/or an infrared sensor, the image sensor and/or the infrared sensor are/is connected to the base substrate 302, for example, on a side of the base substrate 302 away from the light emitting device, and an orthographic projection of the image sensor and/or the infrared sensor on the base substrate 302 at least partially overlaps with the opening region 3011, for example, the image sensor and/or the infrared sensor may be provided at the position indicated by the reference numeral 310 in the figure. Thus, the image sensor and/or the infrared sensor can realize functions of image acquisition, face recognition, infrared sensing and the like through the opening region 3011.

Similarly, in some examples of this embodiment, the display substrate 300 further includes structures such as a second insulation layer 316 covering the capacitor, a planarization layer 317 for planarizing the driving circuit, a pixel definition layer 319 for defining the pixel array, a columnar spacer 308 for forming an encapsulation space, an encapsulation layer 305 for sealing, a second encapsulation layer 306 and a third encapsulation layer 307 for further improving the encapsulation effect, and the like, and these structures are not described in detail in the embodiments of the present disclosure. In some examples of this embodiment, because one of the source and drain electrodes 312 of the thin film transistor is connected to the first electrode layer 318, this thin film transistor is a driving transistor, that is, the driving transistor controls the magnitude of a light emitting current flowing through the light emitting device according to a data signal applied thereto, thereby controlling the gray scale of the pixel units in a display process.

Figure 5C:
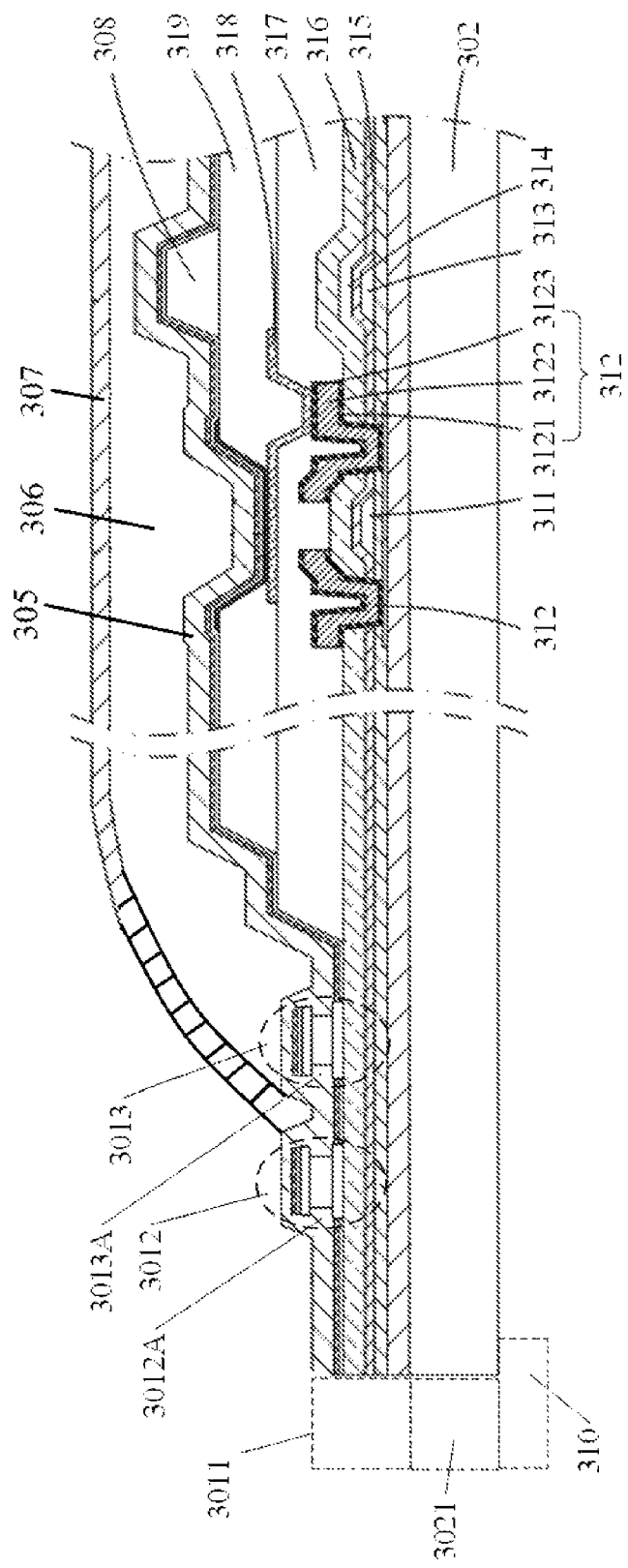
FIG. 5C is another cross-sectional schematic diagram taken along a line C-C illustrated in FIG. 5A.

For example, the encapsulation layer 305 is an inorganic encapsulation layer, including a material such as silicon oxide, silicon nitride, or the like, the second encapsulation layer 306 is an organic encapsulation layer, including an organic material such as polyimide, or the like, and the third encapsulation layer 307 is an inorganic encapsulation layer, including a material such as silicon oxide, silicon nitride, or the like. For example, in the example illustrated in FIG. 5B, all of the encapsulation layer 305, the second encapsulation layer 306, and the third encapsulation layer 307 extend to one side of the first barrier wall 3012 close to the opening region 3011, so that all the three encapsulation layers encapsulate the first barrier wall 3012 and the second barrier wall 3013. In other examples, as illustrated in FIG. 5C, the encapsulation layer 305 extends to the side of the first barrier wall 3012 close to the opening region 2011, and both the second encapsulation layer 206 and the third encapsulation layer 207 terminate between the first barrier wall 3012 and the second barrier wall 3013. For example, in some examples, both the encapsulation layer 305 and the third encapsulation layer 307 may extend to the side of the first barrier wall 3012 close to the opening region 3011, while only the second encapsulation layer 306 terminates between the first barrier wall 3012 and the second barrier wall 3013. For example, in some other examples, both the encapsulation layer 305 and the third encapsulation layer 307 extend to the side of the first barrier wall 3012 close the opening region 3011, while only the second encapsulation layer 306 terminates at the side of the second barrier wall 3013 close to the display region 301. The embodiments of the present disclosure do not limit the specific arrangement of each encapsulation layer.

In some embodiments of the present disclosure, the first barrier wall includes, for example, an insulation layer structure in addition to the above-mentioned first metal layer structure, and the first metal layer structure is stacked on the insulation layer structure to form a first barrier wall with more layers, so as to enhance the barrier effect.

Figure 8A:
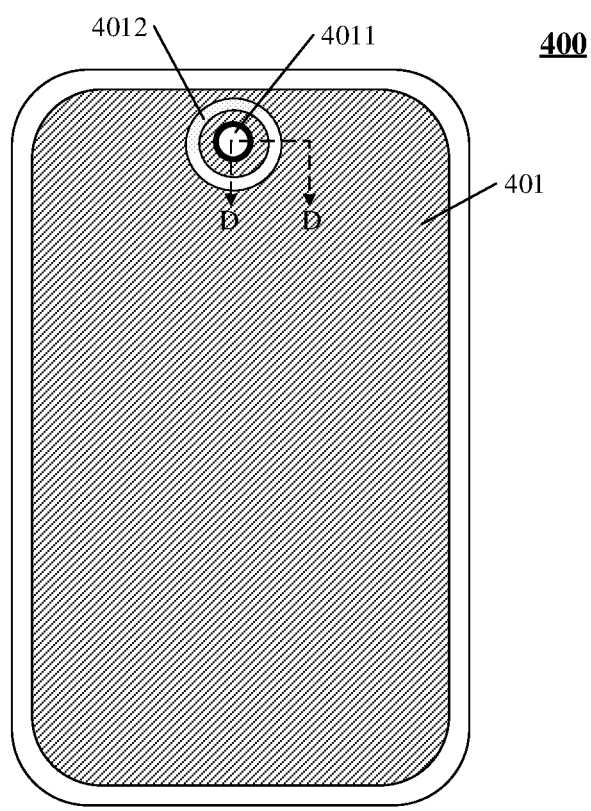
FIG. 8A is a planar schematic diagram of further another display substrate provided by some embodiments of the present disclosure.
Figure 8B:
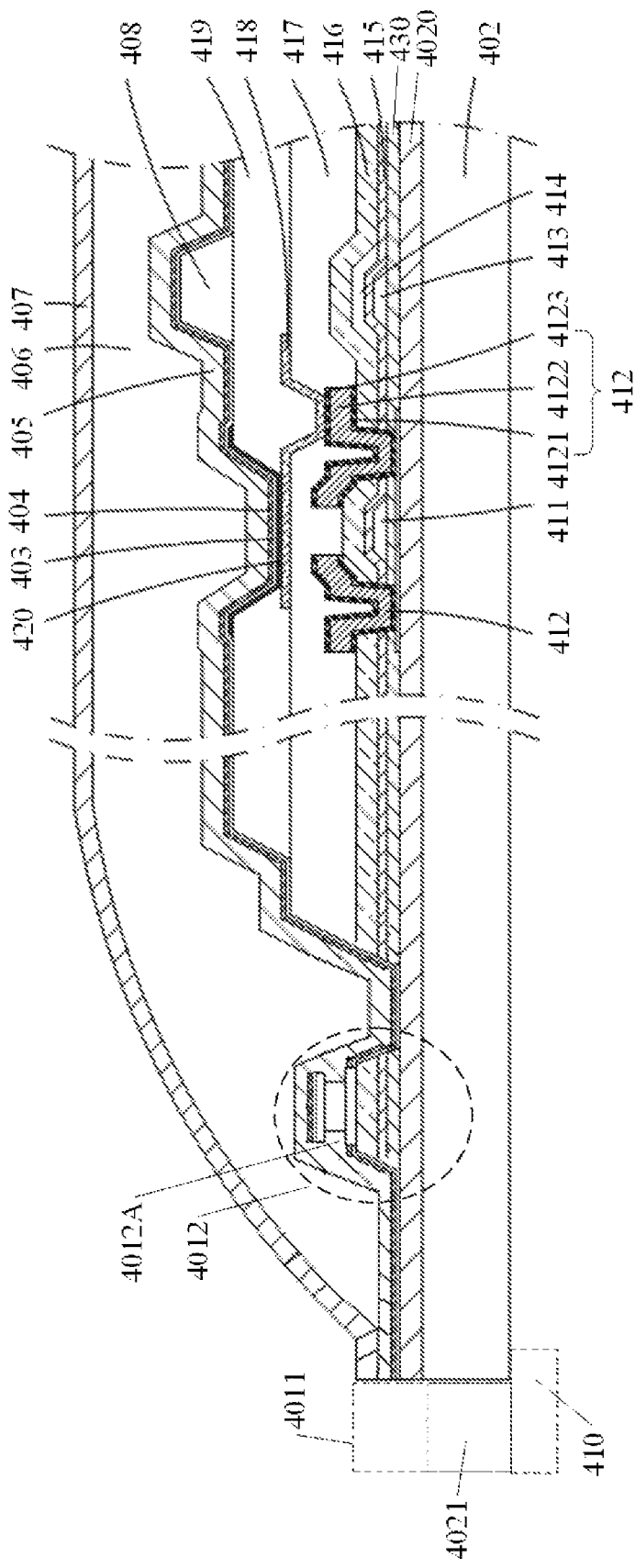
FIG. 8B is a cross-sectional schematic diagram taken along a line D-D illustrated in FIG. 8A.

For example, the display substrate illustrated in FIG. 8A and FIG. 8B includes a first barrier wall having a first metal layer structure and an insulation layer structure, FIG. 8A is a planar schematic diagram of the display substrate, and FIG. 8B is a cross-sectional schematic diagram of the display substrate in FIG. 8A along a line D-D.

As illustrated in FIG. 8A and FIG. 8B, the display substrate 400 includes a display region 401 and an opening region 4011, a first barrier wall 4012 is between the display region 401 and the opening region 4011, the display region 401 surrounds the opening region 4011. the first barrier wall 4012 surrounds the opening region 4011, the first barrier wall 4012 includes a first metal layer structure and an insulation layer structure, and at least one side surface, surrounding the opening region 4011, of the first metal layer structure includes a recess 4012A.

Figure 9:
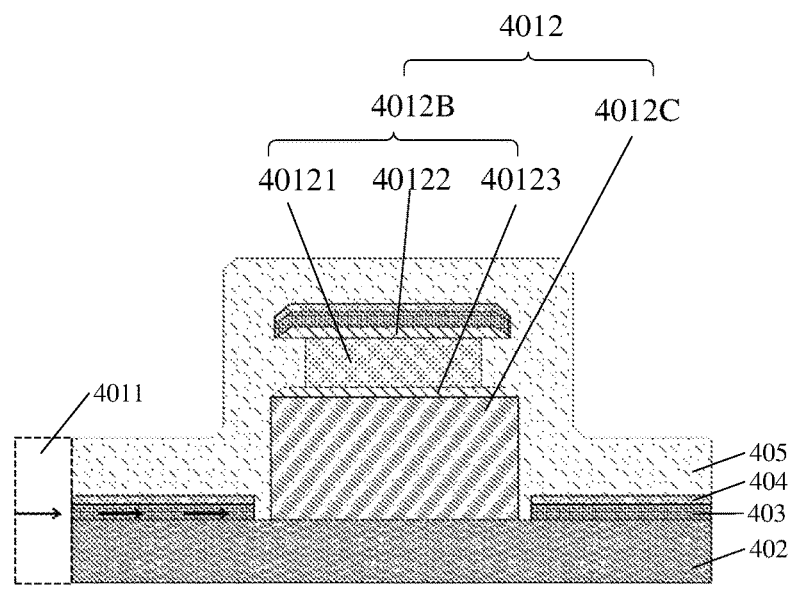
FIG. 9 is a cross-sectional schematic diagram of a barrier wall in further another display substrate provided by some embodiments of the present disclosure.

In one example, as illustrated in FIG. 9, the first barrier wall 4012 includes a first metal layer structure 4012B and an insulation layer structure 4012C. The structure of the first metal layer structure 4012B is basically the same as the first metal layer structure in the above-mentioned embodiments. For detailed description, please refer to the above-mentioned embodiments, similar reference numerals refer to the same structures, respectively, and are not repeated here. The insulation layer structure 4012C includes at least one insulation layer, and for example, the insulation layer is obtained by etching an insulation layer formed under the first metal layer structure 4012B. As illustrated in FIG. 9, a cross section of the insulation layer structure 4012C is formed in a shape of rectangle. In this case, at least a portion of the organic functional layer 403 and the second electrode layer 404 formed after the first barrier wall 4012 is formed are disconnected on a side surface of the insulation layer structure 4012C of the first barrier wall 3012.

Figure 10:
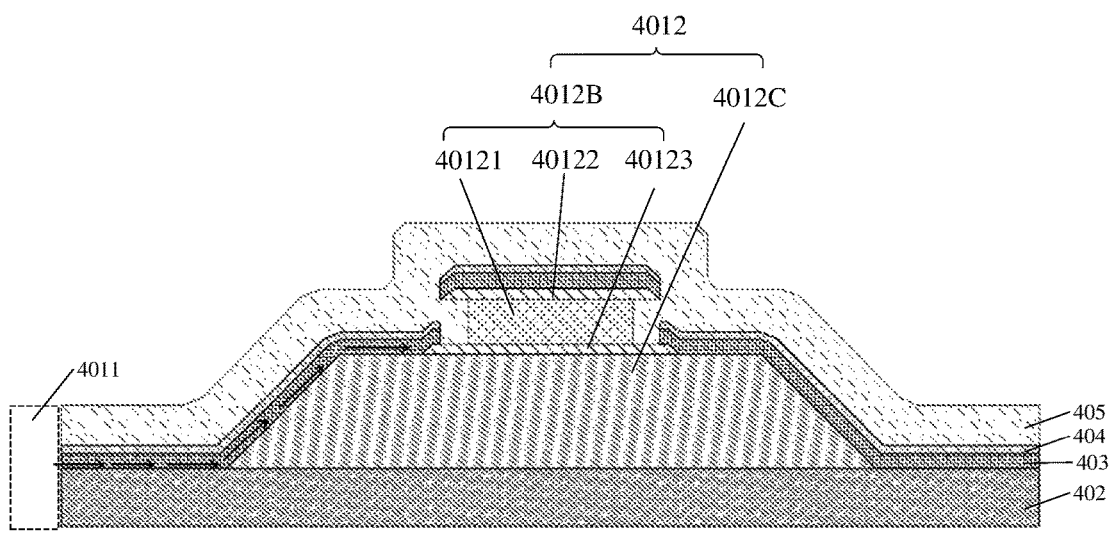
FIG. 10 is a cross-sectional schematic diagram of a barrier wall in further another display substrate provided by some embodiments of the present disclosure.

In one example, as illustrated in FIG. 10, because of process reasons, the cross section of the insulation layer structure 4012C of the first barrier wall 4012 may be formed into a positive trapezoidal structure. In this case, the organic functional layer and the second electrode layer 404 that are formed after the first barrier wall 4012 is formed may extend to the first metal layer structure 4012B along the side surface of the insulation layer structure 4012C of the first barrier wall 3012, and then are disconnected at the side surface of the first metal layer structure 4012B. In this case, an area of a contact region between the second electrode layer 404 and the encapsulation layer 405 formed on the second electrode layer 404 is larger, thereby enhancing the encapsulation effect of the encapsulation layer 405.

On the other hand, the insulation layer structure 4012C generally includes an inorganic material (e.g., silicon nitride, silicon oxide, etc.), and if an edge of the opening region 4011 has an inorganic insulation layer, it is easy to generate cracks in the inorganic insulation layer when forming the opening region 4011, and the cracks is prone to expand to the display region of the display substrate. In this embodiment, the insulation layer formed under the first metal layer structure 4012B is etched to form the insulation layer structure 4012C of the first barrier wall 4012, so that the edge of the opening region 4011 no longer has an inorganic insulation layer, or the inorganic insulation layer material at the edge of the opening region 4011 is reduced, thus an expansion path of the cracks is reduced, and the first barrier wall 4012 can also prevent further expansion of the cracks.

For example, the display substrate illustrated in FIG. 8B has the first barrier wall 4012 as illustrated in FIG. 10, and the insulation layer structure 4012C of the first barrier wall 4012 includes a plurality of insulation sub-layers, for example, includes insulation sub-layers that are respectively in the same layer as a first insulation layer 415 and a second insulation layer 416. For example, in some other embodiments, the insulation layer structure 4012C may further include an insulation sub-layer that is in the same layer as a buffer layer 4020 on the base substrate 402. In this case, the buffer layer 4020 is further etched, so that a part of the surface of the base substrate 402 is exposed, and the exposed part of the surface is in direct contact with the organic functional layer formed later. For example, in some other embodiments, the insulation layer structure 4012C further includes an insulation sub-layer that is in the same layer as a gate insulation layer 430 on the buffer layer 4020. For example, in some other embodiments, the insulation layer structure 4012C may include only one or two insulation sub-layers, and the embodiments of the present disclosure do not limit the number of sub-layers of the insulation layer structure 4012C.

In addition, similar to the above embodiments, the display region 401 further includes an electrode pattern, and the electrode pattern includes a second metal layer structure, the first metal layer structure and the second metal layer structure have the same structure and include the same material(s). For example, the first metal layer structure and the second metal layer structure are formed in the same layer and have the same multi-layer structure.

For example, the display region 401 includes a pixel array, and a plurality of pixel units of the pixel array include a plurality of light emitting devices for display and driving circuits for driving the light emitting devices. For example, the driving circuit includes structures such as a thin film transistor, a capacitor and so on.

As illustrated in FIG. 8B, the light emitting device includes a first electrode layer 418, a second electrode layer 404, and an organic functional layer between the first electrode layer 420 and the second electrode layer 404, the organic functional layer includes an organic light emitting material layer 420 and an auxiliary light emitting layer 403.

At least a portion of the organic functional layer, such as the auxiliary light emitting layer 403, and the second electrode layer 404, are generally formed on the whole surface of the display region 401, and in this case, the organic functional layer is disconnected at the side surface, including the recess 4012A, of the first barrier wall 4012. For example, the first electrode layer 418 is an anode layer, the second electrode layer 404 is a cathode layer, and the cathode layer is also disconnected at the side surface, including the recess 4012A, of the first barrier wall 4012. For example, a portion of the organic functional layer and a portion of the second electrode layer 404 are also formed on the top of the first barrier wall 4012, but these portions are separated from other portions of the organic functional layer and the second electrode layer 404.

Similarly, the thin film transistor includes a gate electrode 411, source and drain electrodes 412, etc., and the capacitor includes a first electrode 413, a second electrode 414, and a first insulation layer 415 between the first electrode 413 and the second electrode 414. For example, the gate 411 electrode or each of the source and drain electrodes 412 may be implemented as the electrode pattern having the second metal layer structure. For example, it is illustrated in FIG. 8B that each of the source and drain electrodes 412 includes the second metal layer structure, the first metal layer structure of the first barrier wall 4012 and the second metal layer structure of the source and drain electrode 412 are formed in the same layer and have the same multi-layer structure, so that the first metal layer structure of the first barrier wall 4012 and the second metal layer structure of the source and drain electrode 412 may be formed using the same layers in the preparation process of the display substrate 400. For example, in some examples, each of the first metal layer structure and the second metal layer structure has the multi-layer structure, such as a double-layer structure or a three-layer structure, and the like.

As illustrated in FIG. 8B, the display substrate 400 further includes a base substrate 402, and the base substrate 402 has an opening 4021 located in the opening region 4011.

For example, the display substrate 400 further includes an image sensor and/or an infrared sensor, the image sensor and/or the infrared sensor are/is connected to the base substrate 402, for example, on a side of the base substrate 402 away from the lighting emitting device, and an orthographic projection of the image sensor and/or the infrared sensor on the base substrate 402 at least partially overlaps with the opening region 4011, for example, the image sensor and/or the infrared sensor may be provided at the position indicated by the reference numeral 410 in the figure. Thus, the image sensor and/or the infrared sensor can realize functions of image acquisition, face recognition, infrared sensing and the like through the opening region 4011.

Similarly, in some examples of this embodiment, the display substrate 400 further includes structures such as a second insulation layer 416 covering the capacitor, a planarization layer 417 for planarizing the driving circuit, a pixel definition layer 419 for defining the pixel array, a columnar spacer 408 for forming an encapsulation space, an encapsulation layer 405 for sealing, a second encapsulation layer 406 and a third encapsulation layer 407 for further improving the encapsulation effect, and the like, and these structures are not described in detail in the embodiments of the present disclosure. In some examples of this embodiment, because one of the source and drain electrodes 412 of the thin film transistor is connected to the first electrode layer 418, this thin film transistor is a driving transistor, that is, the driving transistor controls the magnitude of a light emitting current flowing through the light emitting device according to a data signal applied thereto, thereby controlling the gray scale of the pixel units in a display process. For example, the arrangement of the encapsulation layer 405, the second encapsulation layer 406, and the third encapsulation layer 407 can be referred to the descriptions in the above-mentioned embodiments and is not described in detail here.

Figure 11:
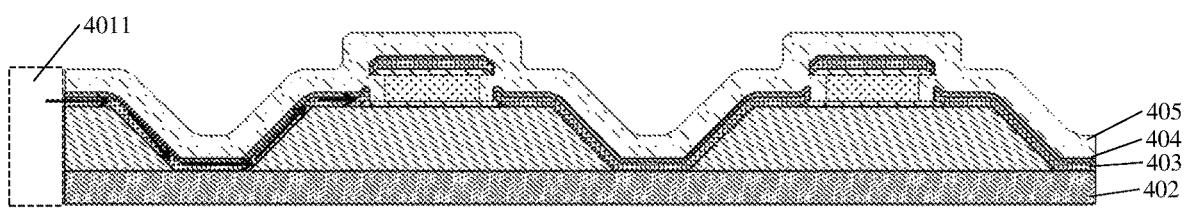
FIG. 11 is a cross-sectional schematic diagram of a barrier wall in further another display substrate provided by some embodiments of the present disclosure.

For example, in other examples of this embodiment, the display substrate 400 may be provided with more than one barrier walls, that is, the display substrate 400 may include multiple barrier walls. referring to FIG. 5A and FIG. 11, the multiple barrier walls form multiple protections for the display region 401.

At least one embodiment of the present disclosure provides a preparation method of a display substrate, and the method comprises: forming a display region and an opening region, and forming a first barrier wall between the display region and the opening region. The display region surrounds the opening region. The first barrier wall surrounds the opening region and comprises a first metal layer structure, and a recess is formed on at least one side surface, surrounding the opening region, of the first metal layer structure.

For example, in one embodiment, forming the display region comprises: forming an electrode pattern when forming the first metal layer structure, in which the electrode pattern comprises a second metal layer structure, and the first metal layer structure and the second metal layer structure are formed using the same layer(s). For example, both the first metal layer structure and the second metal layer structure are multi-layer electrode structures such as double-layer structures or three-layer structures, and the like.

For example, in the case where both the first metal layer structure and the second metal layer structure are the double-layer electrode structures, forming the electrode pattern when forming the first metal layer structure comprises: forming a first metal material layer on a first side of a base substrate, and forming a second metal material layer on a side of the first metal material layer away from the base substrate; performing a first etching process on the first metal material layer and the second metal material layer to form the electrode pattern and an initial barrier wall; performing a second etching process on the initial barrier wall to form the first barrier wall, in which a wet etching method is adopted in the second etching process, and an etching rate produced by an etching solution used in the second etching process on the first metal material layer is larger than an etching rate produced by the etching solution on the second metal material layer, so that the recess is formed.

For example, in the case where both the first metal layer structure and the second metal layer structure are the three-layer electrode structures, forming the electrode pattern when forming the first metal layer structure comprises: sequentially forming a third metal material layer, a first metal material layer and a second metal material layer on a first side of a base substrate; performing a first etching process on the third metal material layer, the first metal material layer and the second metal material layer to form the electrode pattern and an initial barrier wall; performing a second etching process on the initial barrier wall to form the first barrier wall, in which a wet etching method is adopted in the second etching process, and an etching rate produced by an etching solution used in the second etching process on the first metal material layer is larger than an etching rate produced by the etching solution on the second metal material layer and is larger than an etching rate produced by the etching solution on the third metal material layer, so that the recess is formed.

For example, forming the display region further comprises forming a first electrode layer, a second electrode layer, and an organic functional layer between the first electrode layer and the second electrode layer. The first electrode layer, the second electrode layer, and the organic functional layer are configured to form a light emitting device in a display region. The etching solution used for the second etching process is the same as an etching solution used for etching to form the first electrode layer. Therefore, the first barrier wall is formed when the electrode pattern and the first electrode layer are formed, so that original process steps are not increased.

For example, in other embodiments, the first metal layer structure and the second metal layer structure may be formed by only one wet etching process. For example, forming the electrode pattern when forming the first metal layer structure comprises: forming a first metal material layer on a first side of a base substrate; forming a second metal material layer on a side of the first metal material layer away from the base substrate; performing one wet etching process on the first metal material layer and the second metal material layer, in which an etching rate produced by an etching solution used in the wet etching process on the first metal material layer is larger than an etching rate produced by the etching solution on the second metal material layer, so that the recess is formed by only one wet etching process. The method is also suitable for forming the first metal layer structure and the second metal layer structure that have the three-layer structure, which is not be repeated here.

Next, taking the formation of the display substrate 200 illustrated in FIG. 2A and FIG. 2B as an example, the preparation method provided by some embodiments of the present disclosure are described in detail.

Figure 12A:
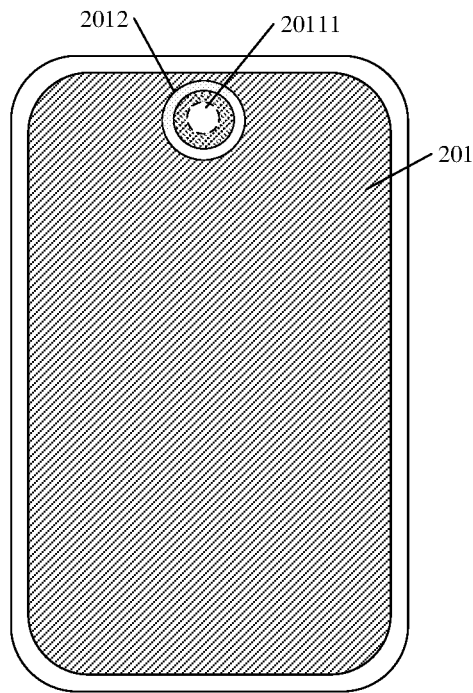
FIG. 12A-FIG. 12B are planar schematic diagrams of a display substrate in a preparation process thereof provided by some embodiments of the present disclosure.

As illustrated in FIG. 12A, the display region 201 and the opening region 2011 are formed first. The opening region 2011 is formed by opening a hole at a position 20111.

Figure 13A:
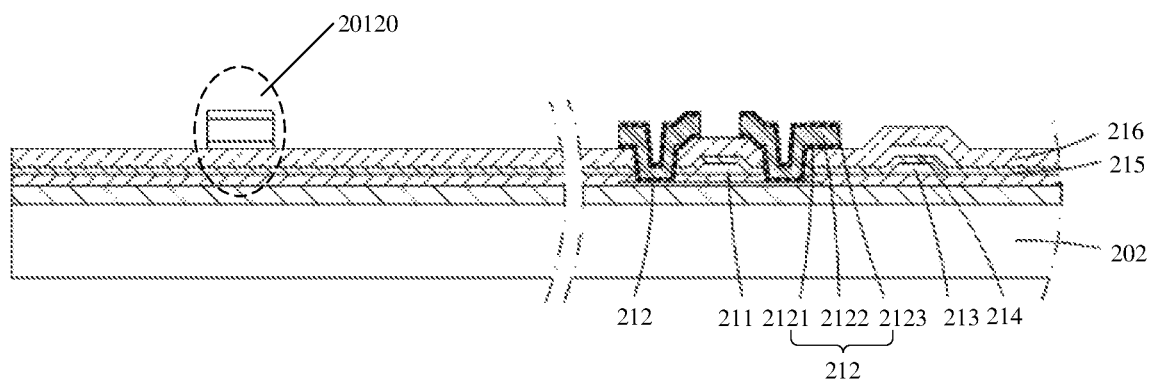
FIG. 13A-FIG. 13C are planar schematic diagrams of a display substrate in a preparation process thereof provided by some embodiments of the present disclosure.
Figure 13B:
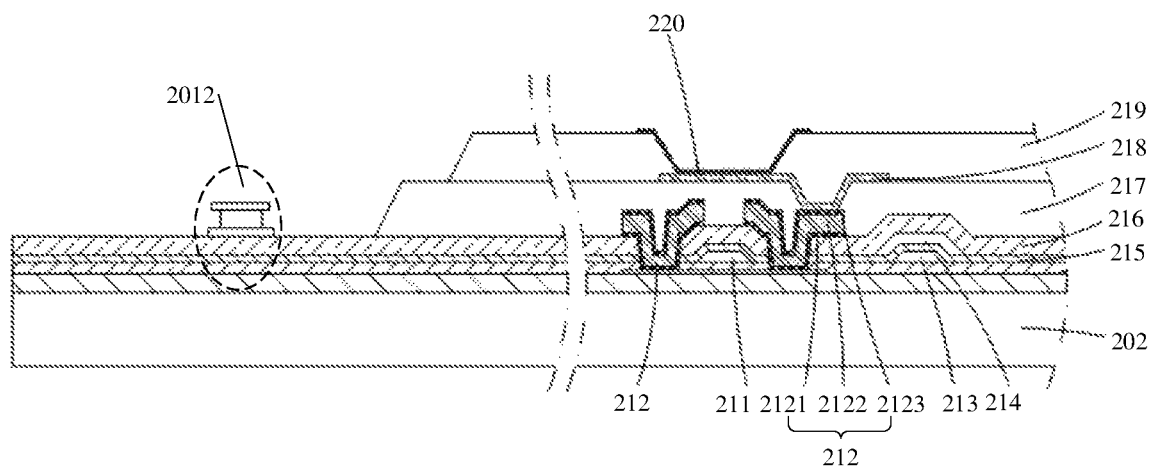
Figure 13C:
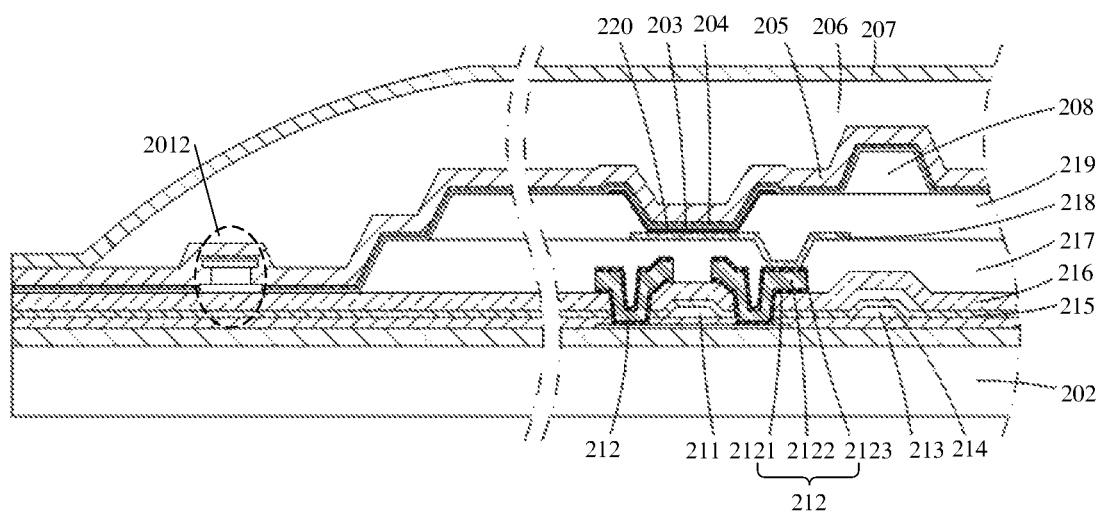

As illustrated in FIG. 13A-FIG. 13C, forming the display region 201 includes forming structures, such as the light emitting devices for forming the pixel array, the driving circuits for driving the light emitting devices, and the like. For example, the first barrier wall 2012 formed between the display region 201 and the opening region 2011 is formed in the same layer as a plurality of functional layers in the display region 201. The embodiments of the present disclosure do not limit the specific structures of the light emitting device of the pixel array and the driving circuit for driving the light emitting device, etc.

As illustrated in FIG. 12A, a driving circuit layer is first formed on the substrate 202, the driving circuit layer includes structures such as a thin film transistor and a storage capacitor, etc. For example, patterning processes are used to sequentially form various film layers of the structures such as the thin film transistor and the storage capacitor, etc. on the substrate 202. For example, one patterning process includes steps such as forming a photoresist, exposure, development, etching, etc.

For example, the gate electrode 211 of the thin film transistor and the first electrode 213 of the storage capacitor are formed using the same film layer by the same one patterning process, so as to simplify the preparation process. For example, a material of the gate electrode 211 and the first electrode 213 of the storage capacitor includes a metal or alloy material such as aluminum, titanium, cobalt, etc. During the preparation process, a gate material layer is first formed by a method such as sputtering or evaporation, and then a patterning process is performed on the gate material layer to form the patterned gate electrode 211 and the first electrode 213 of the storage capacitor.

For example, the source and drain electrodes 212 of the thin film transistor may be formed into multi-layer electrode structures, for example, a titanium material layer, an aluminum material layer and a titanium material layer are sequentially formed by a method such as sputtering or evaporation, and then these three material layers are patterned by the same one patterning process, so as to form the titanium 2121/aluminum 2122/titanium 2123 three-layer electrode structures of the source and drain electrodes 212, and simultaneously forming an initial first barrier wall 20120 surrounding a position 20111 where the opening region 2011 is to be formed. For example, the etching method used in the above patterning process is a dry etching method, so that side surfaces of the formed source and drain electrodes 212 and a side surface of the initial first barrier wall 20120 have flush structures.

As illustrated in FIG. 13B, after each layer of the thin film transistor and the storage capacitor is formed, a planarization layer 217, a first electrode layer 218, and a pixel definition layer 219 are formed, and an organic functional layer is formed in openings of the pixel definition layer 219. The organic functional layer includes an organic light emitting material layer 220, an auxiliary light emitting layer 203, etc.

For example, the planarization layer 217 is formed by a patterning process using an organic material such as a resin material or using an inorganic material such as silicon nitride, silicon oxide, or the like, and a via hole is formed in the planarization layer 217, so that the first electrode layer 218 formed later is connected to the source and drain electrodes 212 through the via hole.

For example, the first electrode layer 218 is formed on the planarization layer 217 by a patterning process. For example, the first electrode layer 218 is an anode layer, and a material of the first electrode layer 218 includes a metal oxide such as ITO and IZO, etc. or includes a metal such as Ag, Al, Mo, or an alloy including at least one of these metals. For example, the first electrode layer 218 is formed on the planarization layer 217 by a patterning process, and the first electrode layer 218 is connected to one of the source and drain electrodes 212 through the via hole in the planarization layer 217.

For example, in the etching process of patterning the first electrode layer 218, the etching solution adopted simultaneously etches the initial first barrier wall 20120, and an etching rate produced by the etching solution on the aluminum which is in the intermediate layer of the titanium/aluminum/titanium three-layer electrode structure of the first barrier wall 20120 is larger than an etching rate produced by the etching solution on the titanium which is on an upper side and an lower side of the titanium/aluminum/titanium three-layer electrode structure of the first barrier wall 20120, thereby forming the recess on the side surface of the initial first barrier wall 20120.

For example, the pixel definition layer 219 exposing the first electrode layer 218 is formed on the first electrode layer 218 by a patterning process. For example, a material of the pixel definition layer 219 includes an organic material such as a resin material or an inorganic material such as silicon nitride, silicon oxide, or the like, and the pixel definition layer 219 has an opening, so as to facilitate the formation of the organic functional layer and the second electrode layer 204 of the light emitting device later.

For example, as illustrated in FIG. 13B, an organic light emitting material layer 220 may be formed in the opening of the pixel definition layer 219 by a method such as ink jet printing, evaporation, or the like. Then, as illustrated in FIG. 13C, the columnar spacer 208, the auxiliary light emitting layer 203, and the second electrode layer 204 are formed on the pixel definition layer 219 on which the organic light emitting material layer 220 is formed.

For example, the columnar spacer 208 is formed by a patterning process using an organic material such as a resin material, etc. or an inorganic material such as silicon nitride or silicon oxide, etc., and the columnar spacer 208 is used for forming the encapsulation space, so as to facilitate the formation of the encapsulation layer later.

For example, the auxiliary light emitting layer 203 and the second electrode layer 204 are formed on the whole surface of the display region by a method such as evaporation, deposition, ink jet printing, or the like. The organic light emitting material layer 220 includes light emitting materials that emit light of different colors such as red, green, or blue, and the auxiliary light emitting layer 203 is, for example, an electron injection layer, an electron transport layer, or the like. The second electrode layer 204 is, for example, the cathode layer, and a material of the second electrode layer 204 includes, for example, a metal such as Mg, Ca, Li or Al or an alloy including at least one of these metals, or a metal oxide such as IZO and ZTO, or an organic material having a conductive property such as PEDOT/PSS (poly 3,4-ethylenedioxythiophene/polystyrene sulfonate). In this case, the organic functional layer and the second electrode layer 204 that are formed on the whole surface of the base substrate are disconnected at the side surface, including the recess, of the first barrier wall 2012, in the figure, both side surfaces of the first barrier wall 2012 have the recesses, therefore both the organic functional layer and the second electrode layer 204 are completely disconnected by the first barrier wall 2012.

Therefore, where a portion of the organic functional layer and a portion of the second electrode layer 204 at a side, close to the opening region 2011, of the first barrier wall 2012 are contaminated, impurities such as water, oxygen and the like cannot diffuse or extend to a portion of the organic functional layer and a portion of the second electrode layer 204 that are used for light emission because of the barrier effect of the first barrier wall 2012. For example, a portion of the organic functional layer and a portion of the second electrode layer 204 are also formed on the top of the first barrier wall 2012.

For example, the encapsulation layer 205 is formed on the second electrode layer 204 by a method such as chemical vapor deposition, physical vapor deposition, coating, or the like. The encapsulation layer 205 can provide encapsulation and protection for the functional structures in the display region. For example, the second encapsulation layer 206 and the third encapsulation layer 207 may be further formed on the encapsulation layer 205. The second encapsulation layer 206 planarizes the encapsulation layer 205, and the third encapsulation layer 207 forms an outer encapsulation. For example, the encapsulation layer 205 and the third encapsulation layer 207 adopt an inorganic material, such as silicon nitride, silicon oxide, silicon oxynitride, and the like, and the second encapsulation layer 206 adopts an organic material, such as polyimide (PI), epoxy, and the like. Therefore, the encapsulation layer 205, the second encapsulation layer 206 and the third encapsulation layer 207 form a composite encapsulation layer, and the composite encapsulation layer forms multiple protection for the functional structures in the display region and has a better encapsulation effect.

In some embodiments of the present disclosure, other necessary functional layers may also be formed in the display region 201 according to needs, and these layers may be formed by conventional methods and are not described here.

Figure 12B:
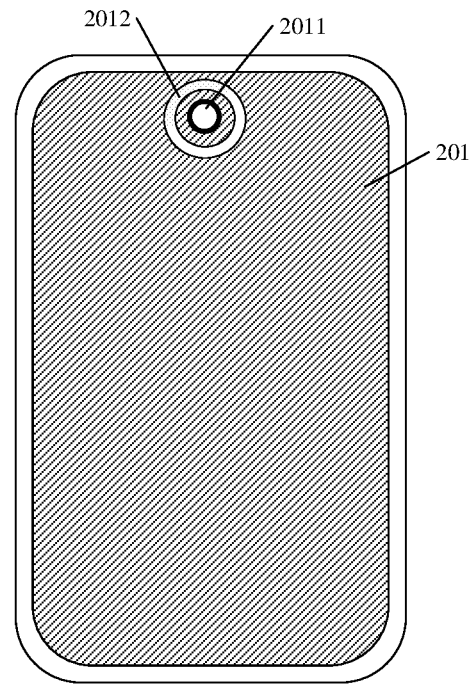

For example, after the display region is formed, as illustrated in FIG. 12B, the opening region 2011 is formed at the position 20111. For example, a method such as laser cutting or mechanical punching is used to open a hole at the position 20111, so as to form the opening region 2011.

For example, the opening region 2011 runs through the base substrate 202, so that an opening hole is also formed in the base substrate 202. A position of the opening hole may be provided with structures such as an image sensor, an infrared sensor and the like, and the structures are in signal connection with a central processing unit and the like. For example, the structures such as the image sensor and the infrared sensor are disposed on the side of the base substrate 202 away from the light emitting device (i.e., a non-display side of the display substrate), and can realize various functions such as photographing, face recognition, infrared sensing and the like through the opening region 2011.

It should be noted that, in the embodiments of the present disclosure, the thin film transistor illustrated is a top gate type thin film transistor, but the embodiments of the present disclosure are not limited thereto, for example, the thin film transistor may also be a bottom gate type thin film transistor. For example, the driving circuit includes a plurality of thin film transistors, and the plurality of thin film transistors may be top gate type thin film transistors or bottom gate type thin film transistors, and may be N type thin film transistors or P type thin film transistors, the embodiments of the present disclosure are not limited in this aspect.

In some embodiments of the present disclosure, the light emitting device is an organic light emitting diode or a quantum dot light emitting diode, for example, the organic light emitting diode is of a top gate emitting type, a bottom emitting type, or a double-side emitting type, and for example, the organic functional layer of the organic light emitting diode is a composite layer including an organic light emitting material layer and other auxiliary light emitting layers such as an electron injection layer, an electron transport layer, a hole transport layer, a hole injection layer, and the like. No limitation is imposed to the specific structure and type of the organic light emitting diode in the embodiments of the present disclosure.

For example, by the preparation method of some embodiments of the present disclosure, the display substrate as illustrated in FIG. 5A and FIG. 5B can be formed, and the preparation method for forming the display substrate as illustrated in FIG. 5A and FIG. 5B has the following differences from the above examples. Where the display substrate as illustrated in FIG. 5A and FIG. 5B are formed, the second barrier wall is formed between the display region and the opening region of the display substrate, the second barrier wall surrounds the opening region and is formed on the side of the first barrier wall away from the opening region. In this case, for example, the second barrier wall is formed using the same film layer as the first barrier wall, so that the multiple barrier walls can realize a better barrier effect without increasing steps of the preparation process.

For example, by the preparation method of some embodiments of the present disclosure, the display substrate as illustrated in FIG. 8A and FIG. 8B can be formed, and the preparation method for forming the display substrate as illustrated in FIG. 8A and FIG. 8B has the following differences from the above examples. Where the display substrate as illustrated in FIG. 8A and FIG. 8B is formed, forming the first barrier wall further includes etching the insulation layer which is under the first metal layer structure of the first barrier wall, for example, this etching process is performed before forming the first metal layer structure or after forming the first metal layer structure, and for example, this etching process is performed when etching other insulation layers (e.g., etching to form the via holes where the source and drain electrodes 412 are located), so that the first barrier wall with a better barrier effect is obtained without increasing steps of the preparation process.

Figure 14:
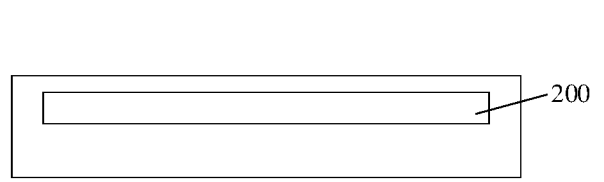
FIG. 14 is a schematic diagram of display device provided by some embodiments of the present disclosure.

At least one embodiment of the present disclosure further provides a display device. As illustrated in FIG. 14, the display device 500 includes any one of the display substrates provided by the embodiments of the present disclosure, and the display substrate 200 is illustrated in the figure. The display device 500 may be any product or component with a display function such as a mobile phone, a tablet computer, a television, a display, a notebook computer, a digital photo frame, a navigator, etc., and no limitation is imposed to this in the embodiments of the present disclosure.

The following should be noted:

(1) The accompanying drawings involve only the structure(s) in connection with the embodiment(s) of the present disclosure, and other structure(s) can be referred to common design(s).

(2) For the purpose of clarity, in accompanying drawings for illustrating the embodiment(s) of the present disclosure, the thickness of a layer or a region may be enlarged or narrowed, that is, the drawings are not drawn in a real scale. However, it should be understood that, in the case where a component such as a layer, a film, a region, a substrate, or the like is referred to be "on" or "under" another component, the component may be "directly" "on" or "under" the another component, or an intermediate component may be disposed therebetween.

(3) In case of no conflict, the embodiments of the present disclosure and the features in the embodiments can be combined to obtain new embodiments.

What have been described above are only specific implementations of the present disclosure, the protection scope of the present disclosure is not limited thereto. Any modification or substitution easily occur to those skilled in the art within the technical scope of the present disclosure should be within the protection scope of the present disclosure. Therefore, the protection scope of the present disclosure should be based on the protection scope of the claims.

What is claimed is:

1. A display substrate, comprising a display region and an opening region, the display region surrounding the opening region,
   wherein a first barrier wall is between the display region and the opening region, and the first barrier wall surrounds the opening region;
   the first barrier wall comprises a first metal layer structure, and at least one side surface, surrounding the opening region, of the first metal layer structure comprises a recess;
   the display substrate further comprises a base substrate, the first metal layer structure comprises:
   a first metal sub-layer on a first side of the base substrate, and
   a second metal sub-layer on a side of the first metal sub-layer away from the base substrate,
   wherein an orthographic projection of the first metal sub-layer on the base substrate is within an orthographic projection of the second metal sub-layer on the base substrate, so as to form the recess.

2. The display substrate according to claim 1, wherein the display region comprises an electrode pattern,
the electrode pattern comprises a second metal layer structure, the first metal layer structure and the second metal layer structure have a same structure and comprise a same material.

3. The display substrate according to claim 1, wherein the first metal layer structure further comprises a third metal sub-layer on the first side of the base substrate,
the first metal sub-layer is on a side of the third metal sub-layer away from the base substrate, and the orthographic projection of the first metal sub-layer on the base substrate is within an orthographic projection of the third metal sub-layer on the base substrate; and
the orthographic projection of the second metal sub-layer on the base substrate is within the orthographic projection of the third metal sub-layer on the base substrate.

4. The display substrate according to claim 3, wherein a thickness of the first metal sub-layer is larger than a thickness of the second metal sub-layer and is larger than a thickness of the third metal sub-layer; and
the thickness of the first metal sub-layer ranges from 150 nm to 900 nm, the thickness of the second metal sub-layer ranges from 30 nm to 300 nm, and the thickness of the third metal sub-layer ranges from 30 nm to 300 nm.

5. The display substrate according to claim 1, wherein an indentation direction of the recess is parallel to the base substrate.

6. The display substrate according to claim 1, further comprising a second barrier wall that is between the display region and the opening region,
wherein the second barrier wall surrounds the opening region, has a same structure as the first barrier wall, and is arranged on a side of the first barrier wall away from the opening region.

7. The display substrate according to claim 1, wherein the display region further comprises a first electrode layer, a second electrode layer, and an organic functional layer between the first electrode layer and the second electrode layer,
the first electrode layer, the second electrode layer, and the organic functional layer are configured to form a light emitting device; and the organic functional layer is disconnected at the side surface, comprising the recess, of the first barrier wall;
the second electrode layer is a cathode layer, and the cathode layer is disconnected at the side surface, comprising the recess, of the first barrier wall.

8. The display substrate according to claim 1, further comprising a sensor,
wherein the sensor is connected to the base substrate, and an orthographic projection of the sensor on the base substrate at least partially overlaps with the opening region.

9. The display substrate according to claim 1, wherein under action of an etching solution for etching to form the first metal layer structure, an etching rate of a material of the first metal sub-layer is larger than an etching rate of a material of the second metal sub-layer;
the material of the first metal sub-layer comprises aluminum or copper; and the material of the second metal sub-layer comprises titanium or molybdenum.

10. The display substrate according to claim 1, wherein the first barrier wall further comprises an insulation layer structure,
the insulation layer structure is on the first side of the base substrate, and the first metal layer structure is on a side of the insulation layer structure away from the base substrate; and
the insulation layer structure comprises a plurality of insulation sub-layers.

11. A display device, comprising the display substrate according to claim 1.

12. A preparation method of a display substrate, comprising:
forming a display region and an opening region, wherein the display region surrounds the opening region, and
forming a first barrier wall between the display region and the opening region, wherein the first barrier wall surrounds the opening region and comprises a first metal layer structure, and a recess is formed on at least one side surface, surrounding the opening region, of the first metal layer structure;
wherein the preparation method further comprises: providing a base substrate,
the first metal layer structure comprises:
a first metal sub-layer on a first side of the base substrate, and
a second metal sub-layer on a side of the first metal sub-layer away from the base substrate,
wherein an orthographic projection of the first metal sub-layer on the base substrate is within an orthographic projection of the second metal sub-layer on the base substrate, so as to form the recess.

13. The preparation method according to claim 12, wherein the opening region is formed by laser cutting or mechanical punching.

14. The preparation method of claim 12, wherein forming the display region comprises:
forming an electrode pattern when forming the first metal layer structure,
wherein the electrode pattern comprises a second metal layer structure, and the first metal layer structure and the second metal layer structure are formed using a same layer.

15. The preparation method of claim 14, wherein forming the first barrier wall comprises:
forming a first metal material layer on a first side of the base substrate, and forming a second metal material layer on a side of the first metal material layer away from the base substrate;
performing a first etching process on the first metal material layer and the second metal material layer to form the electrode pattern and an initial barrier wall; and
performing a second etching process on the initial barrier wall to form the first barrier wall, wherein a wet etching method is adopted in the second etching process, and an etching rate produced by an etching solution used in the second etching process on the first metal material layer is larger than an etching rate produced by the etching solution on the second metal material layer, so that the recess is formed.

16. The preparation method of claim 14, wherein forming the first barrier wall comprises:
sequentially forming a third metal material layer, a first metal material layer and a second metal material layer on a first side of the base substrate;

performing a first etching process on the third metal material layer, the first metal material layer and the second metal material layer to form the electrode pattern and an initial barrier wall; and performing a second etching process on the initial barrier wall to form the first barrier wall, wherein a wet etching method is adopted in the second etching process, and an etching rate produced by an etching solution used in the second etching process on the first metal material layer is larger than an etching rate produced by the etching solution on the second metal material layer and is larger than an etching rate produced by the etching solution on the third metal material layer, so that the recess is formed.

17. The preparation method according to claim 15, wherein the first etching process adopts a dry etching method.

18. The preparation method according to claim 15, wherein forming the display region further comprises:

forming a first electrode layer, a second electrode layer, and an organic functional layer between the first electrode layer and the second electrode layer, wherein the first electrode layer, the second electrode layer, and the organic functional layer are configured to form a light emitting device, the etching solution used in the second etching process is same as an etching solution used for etching to form the first electrode layer, and the organic functional layer is disconnected at the side surface, comprising the recess, of the first barrier wall.

19. The preparation method of claim 14, wherein forming the first barrier wall comprises:

forming a first metal material layer on a first side of the base substrate;

forming a second metal material layer on a side of the first metal material layer away from the base substrate; and performing one wet etching process on the first metal material layer and the second metal material layer, wherein an etching rate produced by an etching solution used in the wet etching process on the first metal material layer is larger than an etching rate produced by the etching solution on the second metal material layer.

* * * * *

UNITED STATES PATENT AND TRADEMARK OFFICE
CERTIFICATE OF CORRECTION

| | |
|---|---|
| PATENT NO. | : 11,575,102 B2 |
| APPLICATION NO. | : 16/642099 |
| DATED | : February 7, 2023 |
| INVENTOR(S) | : Weiyun Huang et al. |

It is certified that error appears in the above-identified patent and that said Letters Patent is hereby corrected as shown below:

On the Title Page

Assignee(s) name should read:
--(73) Assignees: CHENGDU BOE OPTOELECTRONICS TECHNOLOGY CO., LTD., Chengdu (CN); BOE TECHNOLOGY GROUP CO., LTD., Beijing (CN)--

Signed and Sealed this
Thirtieth Day of May, 2023

Katherine Kelly Vidal
*Director of the United States Patent and Trademark Office*